(12) United States Patent
Shinde

(10) Patent No.: US 6,181,733 B1
(45) Date of Patent: Jan. 30, 2001

(54) DIGITAL MATCHED FILTER

(75) Inventor: Hiroki Shinde, Kawasaki (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/194,009

(22) PCT Filed: Jul. 30, 1997

(86) PCT No.: PCT/JP97/02647

§ 371 Date: Nov. 19, 1998

§ 102(e) Date: Nov. 19, 1998

(87) PCT Pub. No.: WO99/06922

PCT Pub. Date: Feb. 11, 1999

(51) Int. Cl.[7] ............... H04K 1/00; H04L 27/06
(52) U.S. Cl. ............................. 375/152; 375/343
(58) Field of Search .................... 375/343, 142, 375/143, 150, 152; 364/717; 327/164; 377/64, 75, 76, 67; 708/314

(56) References Cited

U.S. PATENT DOCUMENTS

| | | |
|---|---|---|
| 3,950,635 | 4/1976 | Constant . |
| 4,025,772 | 5/1977 | Constant . |
| 4,400,790 * | 8/1983 | Chambers et al. .................. 364/728 |
| 5,396,446 | 3/1995 | Shou et al. . |
| 5,499,265 * | 3/1996 | Dixon et al. .......................... 375/130 |
| 5,566,202 * | 10/1996 | Lang .................................... 375/210 |
| 5,778,022 * | 7/1998 | Wally ................................... 375/140 |
| 5,892,792 * | 4/1999 | Wally ................................... 375/140 |
| 6,031,415 * | 2/2000 | Shou et al. .......................... 375/343 |

FOREIGN PATENT DOCUMENTS

| | | |
|---|---|---|
| 5252141 | 9/1993 | (JP) . |
| 8065205 | 3/1996 | (JP) . |
| 9116522 | 5/1997 | (JP) . |

OTHER PUBLICATIONS

"LSI, 110mW for Digital Portable Telephone CDMA and Reduction of Consumption Power", Nikkei Electronics, No. 656, pp. 14–15, Feb., 1996.

"Spectrum Spread Handbook Edition No. 4", Stanford Telecom Inc., 1996.

Sawahashi, et al., "Low Power Consumption Matched Filter LSI for Wideband DS–CDMA", Technical Study Report of the Institute of Electronic Information Communication (Radio Communication), RCS95–120, Jan., 1996.

* cited by examiner

Primary Examiner—Tesfaldet Bocure
(74) Attorney, Agent, or Firm—Stevens, Davis, Miller & Mosher, L.L.P.

(57) ABSTRACT

Consumption power is reduced in a digital matched filter for determining a correlation value between a digital signal ($I_o$) of 6 bits, which is synchronous with a clock, and a despreading code sequence ($C_7$ $C_6$ $C_5$ $C_4$ $C_3$ $C_2$ $C_1$ $C_0$) which includes 8 despreading codes. First to eighth flip-flop sets (211–218) constituting a storage section (210) are sequentially selected clock by clock by a write selection circuit (220), and the digital signal ($I_o$) is stored in the selected flip-flop set. The 8 despreading codes are stored in first to eighth code flip-flops (231–238), respectively, and are shifted in synchronism with the clock. Output signals of the first to eighth flip-flop sets are multiplied by output signals of the first to eighth code flip-flops in first to eighth multiplication circuits (241–248), respectively.

12 Claims, 10 Drawing Sheets

DIGITAL MATCHED FILTER

TECHNICAL FIELD

The present invention relates to a digital matched filter, and more particularly to a digital matched filter suitable for use as a correlation detector which performs correlation detection of a spectrum spread signal in a portable telephone or the like.

BACKGROUND ART

In a spectrum spread communication based on a code division multiplex access (CDMA) system which has been studied for use in the portable telephone or the like, a matched filter is used when a spectrum spread signal is demodulated to an original narrow-band signal (for example, "LSI, 110 mw for Digital Portable Telephone CDMA and Reduction of Consumption Power", Nikkei Electronics, No. 656, pp. 14–15, February, 1996).

FIG. 1 is a block diagram showing a conventional example of an eight-times spread 8-order digital matched filter constructed by using a FIR digital filter (for example, "Spectrum Spread Handbook Edition No. 4", Stanford Telecom Inc., 1996). A transfer function H(z) of this digital matched filter is expressed by the following equation.

$$H(z)=C_0+C_1Z^{-1}+C_2Z^{-2}+C_3Z^{-3}++C_4Z^{-4}+C_5Z^{-5}+C_6Z^{-6}+C_7Z^{-7} \quad (1)$$

This digital matched filter comprises a signal input terminal 1, a clock input terminal 2, a tapped shift register 10 including first to seventh flip-flop sets 11–17, first to eighth multipliers 21–28, first to seventh adders 31–37, and an output terminal 5. Here, each of the first to seventh flip-flop sets 11–17 constituting the tapped shift register 10 includes 6 flip-flops connected in parallel to each other.

A digital signal $I_o$ generated by sampling an analog signal (for example, a spectrum spread signal) at a sampling frequency of 4.096 MHz is inputted to the signal input terminal 1. The digital signal $I_o$ is a 6-bit digital signal in terms of two's complement that is synchronous with a clock CLK of 4.096 MHz inputted to the clock input terminal 2. The digital signal $I_o$ is applied to the first flip-flop set 11 of the tapped shift register 10, and then is sequentially shifted from the first flip-flop set 11 toward the seventh flip-flop set 17 in synchronism with the clock CLK.

Each of the first to eighth multipliers 21–28 is a multiplier for 6 bits×1 bit, and outputs an output signal of 6 bits. In the first multiplier 21, multiplication of the digital signal $I_o$ (6 bits) by a despreading code $C_0$ (1 bit) of an 8-bit despreading code sequence $C_7\ C_6\ C_5\ C_4\ C_3\ C_2\ C_1\ C_o$ is carried out. In the second to eighth multipliers 22–28, multiplication operations of output signals of the first to seventh flip-flop sets 11–17 by the despreading codes $C_1$–$C_7$ are carried out, respectively.

For example, when the despreading code indicates "0", the multiplication operations of the digital signal $I_o$ and the output signals of the first to seventh flip-flop sets 11–17 by "−1" are carried out in the multipliers 21–28, respectively. When the despreading code indicates "1", the multiplication operations of the digital signal $I_o$ and the output signals of the first to seventh flip-flop sets 11–17 by "1" are carried out, respectively. The method of the multiplication operations in the multipliers 21–28 is not limited to this. For example, when the despreading code indicates "0", the multiplication operations of the digital signal $I_o$ and the output signals of the first to seventh flip-flop sets 11–17 by "1" may be carried out, respectively. When the despreading code indicates "1", the multiplication operations of the digital signal $I_o$ and the output signals of the first to seventh flip-flops 11–17 by "−1" may be carried out, respectively.

The procedure for the multiplication in each of the multipliers 21–28 will be described hereunder with reference to FIG. 2.

In the initial state, all of the output signals of the first to seventh flip-flop sets 11–17 constituting the tapped shift register 10 are rendered to be "0".

In the first operation state, a first sampling data $D_0$ of the digital signal $I_o$ is inputted to the signal input terminal 1, and then the multiplication of the sampling data $D_0$ by the despreading code $C_0$ is carried out in the first multiplier 21. Accordingly, an output signal indicative of a value of $D_0\times C_0$ is outputted from the first multiplier 21.

In the second operation state, a second sampling data $D_1$ of the digital signal $I_o$ is inputted to the signal input terminal 1 in synchronism with the clock CLK, and the first sampling data $D_0$ is fetched in the first flip-flop set 11. As a result, the multiplication of the second sampling data DI by the despreading code $C_0$ is carried out in the first multiplier 21, and the multiplication of the first sampling data $D_0$ by the despreading code $C_1$ is carried out in the second multiplier 22. Accordingly, an output signal indicative of a value of $D_1\times C_0$ is outputted from the first multiplier 21, and an output signal indicative of a value of $D_0\times C_1$ is outputted from the second multiplier 22.

In the third operation state, a third sampling data $D_2$ of the digital signal $I_o$ is inputted to the signal input terminal 1 in synchronism with the clock CLK, the first sampling data $D_0$ is fetched in the second flip-flop set 12, and the second sampling data $D_1$ is fetched in the first flip-flop set 11. As a result, the multiplication of the third sampling data $D_2$ by the despreading code $C_0$ is carried out in the first multiplier 21, the multiplication of the second sampling data $D_1$ by the despreading code $C_1$ is carried out in the second multiplier 22, and the multiplication of the first sampling data $D_0$ by the despreading code $C_2$ is carried out in the third multiplier 23. Accordingly, an output signal indicative of a value of $D_2\times C_0$ is outputted from the first multiplier 21, an output signal indicative of a value of $D_1\times C_1$ is outputted from the second multiplier 22, and an output signal indicative of a value of $D_0\times C_2$ is outputted from the third multiplier 23. Subsequently, a similar operation is repeated until a seventh operation state.

In the eighth operation state, an eighth sampling data $D_7$ of the digital signal $I_o$ is inputted to the signal input terminal 1 in synchronism with the clock CLK, and the first to seventh sampling data $D_0$–$D_6$ are fetched in the seventh to first flip-flop sets 17–11, respectively. Accordingly, an output signal indicative of a value of $D_7\times C_0$ is outputted from the first multiplier 21, an output signal indicative of a value of $D_6\times C_1$ is outputted from the second multiplier 22, an output signal indicative of a value of $D_5\times C_2$ is outputted from the third multiplier 23, an output signal indicative of a value of $D_4\times C_3$ is outputted from the fourth multiplier 24, an output signal indicative of a value of $D_3\times C_4$ is outputted from the fifth multiplier 25, an output signal indicative of a value of $D_2\times Cs$ is outputted from the sixth multiplier 26, an output signal indicative of a value of $D_1\times C_6$ is outputted from the seventh multiplier 27, and an output signal indicative of a value of $D_0\times C_7$ is outputted from the eighth multiplier 28.

Through the above operation, the multiplication operations necessary to determine a correlation value between the initial 8 sampling data $D_0$–$D_7$ of the digital signal $I_o$ and the 8-bit despreading code sequence $C_7\ C_6\ C_5\ C_4\ C_3\ C_2\ C_1\ C_0$ are all carried out.

In the ninth operation state, a ninth sampling data $D_8$ of the digital signal $I_o$ is inputted to the signal input terminal 1 in synchronism with the clock CLK, and the second to eighth sampling data $D_1$–$D_7$ are fetched in the seventh to first flip-flop sets 17–11, respectively. Accordingly, an output signal indicative of a value of $D_8 \times C_0$ is outputted from the first multiplier 21, an output signal indicative of a value of $D_7 \times C_1$ is outputted from the second multiplier 22, an output signal indicative of a value of $D_6 \times C_2$ is outputted from the third multiplier 23, an output signal indicative of a value of $D_5 \times C_3$ is outputted from the fourth multiplier 24, an output signal indicative of a value of $D_4 \times C_4$ is outputted from the fifth multiplier 25, an output signal indicative of a value of $D_3 \times C_5$ is outputted from the sixth multiplier 26, an output signal indicative of a value of $D_2 \times C_6$ is outputted from the seventh multiplier 27, and an output signal indicative of a value of $D_1 \times C_7$ is outputted from the eighth multiplier 28. As a result, the multiplication operations necessary to determine a correlation value of 8 sampling data $D_1$–$D_8$, which are one sampling after the initial 8 sampling data $D_0$–$D_7$ of the digital signal $I_o$, and the 8-bit despreading code sequence $C_7$ $C_6$ $C_5$ $C_4$ $C_3$ $C_2$ $C_1$ $C_0$ are all carried out. Subsequently, a similar operation is repeated.

Each of the first to fourth adders 31–34 is an adder for 6 bits+6 bits, and outputs an output signal of 7 bits. Each of the fifth and sixth adders 35 and 36 is an adder for 7 bits+7 bits, and outputs an output signal of 8 bits. The seventh adder 37 is an adder for 8 bits+8 bits, and outputs an output signal of 9 bits. In the first adder 31, addition of the output signal (6 bits) of the first multiplier 21 and the output signal (6 bits) of the second multiplier 22 is carried out. In the second adder 32, addition of the output signal (6 bits) of the third multiplier 23 and the output signal (6 bits) of the fourth multiplier 24 is carried out. In the third adder 33, addition of the output signal (6 bits) of the fifth multiplier 25 and the output signal (6 bits) of the sixth multiplier 26 is carried out. In the fourth adder 34, addition of the output signal (6 bits) of the seventh multiplier 27 and the output signal (6 bits) of the eighth multiplier 28 is carried out. In the fifth adder 35, addition of the output signal (7 bits) of the first adder 31 and the output signal (7 bits) of the second adder 32 is carried out. In the sixth adder 36, addition of the output signal (7 bits) of the third adder 33 and the output signal (7 bits) of the fourth adder 34 is carried out. In the seventh adder 37, addition of the output signal (8 bits) of the fifth adder 35 and the output signal (8 bits) of the sixth adder 36 is carried out. As a result, a correlation value MFOUT between the digital signal $I_o$ and the despreading code sequence $C_7$ $C_6$ $C_5$ $C_4$ $C_3$ $C_2$ $C_1$ $C_0$ is obtained in the seventh adder 37, and is outputted to the outside through the output terminal 5.

Next, a digital matched filter used when a receiving signal is over-sampled will be described.

In a case where the receiving timing is detected by performing the correlation detection of the receiving signal in the portable telephone or the like, in order to improve the accuracy of the receiving timing detection, the receiving signal is usually m-times over-sampled in relation to a chip rate frequency, and then is inputted to the matched filter. When the receiving signal is doubly over-sampled, a transfer function H(z) is expressed by the following equation.

$$H(z) = C_0 + C_1 Z^{-2} + C_2 Z^{-4} + C_3 Z^{-6} + C_4 Z^{-8} + C_5 Z^{-10} + C_6 Z^{-12} + C_7 Z^{-14} \quad (2)$$

FIG. 3 is a block diagram showing a conventional example of an eight-times spread 16-order digital matched filter constructed by using an FIR 2-times over-sampling interpolation digital filter. The digital matched filter comprises a signal input terminal 101, a clock input terminal 102, a tapped shift register 110 including first to fourteenth flip-flop sets 111–124, first to eighth multipliers 131–138, first to seventh adders 141–147, and an output terminal 105. Here, each of the first to fourteenth flip-flop sets 111–124 constituting the tapped shift register 110 includes 6 flip-flops connected in parallel to each other.

A digital signal $I_o$ generated by doubly over-sampling an analog signal (for example, a spectrum spread signal) at a sampling frequency of 8.192 MHz is inputted to the signal input terminal 101. The digital signal $I_o$ is a 6-bit digital signal in terms of two's complement that is synchronous with a clock CLK of 8.192 MHz inputted to the clock input terminal 102. The digital signal $I_o$ is applied to the first flip-flop set 111 of the tapped shift register 110, and then is sequentially shifted from the first flip-flop set 111 toward the fourteenth flip-flop set 124 in synchronism with the clock CLK.

Each of the first to eighth multipliers 131–138 is a multiplier for 6 bits×1 bit, and outputs an output signal of 6 bits. In the first multiplier 131, multiplication of the digital signal $I_o$ (6 bits) by a despreading code $C_0$ (1 bit) of an 8-bit despreading code sequence $C_7$ $C_6$ $C_5$ $C_4$ $C_3$ $C_2$ $C_1$ $C_0$ is carried out. In the second to eighth multipliers 132–138, multiplication operations of output signals of the even flip-flop sets 112, 114, 116, 118, 120, 122 and 124 of the tapped shift register 110 by despreading codes $C_1$–$C_7$ are carried out, respectively.

For example, when the despreading code indicates "0", the multiplication operations of the digital signal $I_o$ and the output signals of the even flip-flop sets 112, 114, 116, 118, 120, 122 and 124 by "−1" are carried out in the multipliers 131–138, respectively. When the despreading code indicates "1", the multiplication operations of the digital signal $I_o$ and the output signals of the even flip-flop sets 112, 114, 116, 118, 120, 122 and 124 by "1" are carried out, respectively. The method of multiplication in the multipliers 131–138 is not limited to this. For example, when the despreading code indicates "0", the multiplication operations of the digital signal $I_o$ and the output signals of the even flip-flop sets 112, 114, 116, 118, 120, 122 and 124 by "1" may be carried out, respectively. When the despreading code indicates "1", the multiplication operations of the digital signal $I_o$ and the output signals of the even flip-flop sets 112, 114, 116, 118, 120, 122 and 124 by "−1" may be carried out, respectively.

Each of the first to fourth adders 141–144 is an adder for 6 bits+6 bits, and outputs an output signal of 7 bits. Each of the fifth and sixth adders 145 and 146 is an adder for 7 bits+7 bits, and outputs an output signal of 8 bits. The seventh adder 147 is an adder for 8 bits+8 bits, and outputs an output signal of 9 bits. In the first adder 141, addition of the output signal (6 bits) of the first multiplier 131 and the output signal (6 bits) of the second multiplier 132 is carried out. In the second adder 142, addition of the output signal (6 bits) of the third multiplier 133 and the output signal (6 bits) of the fourth multiplier 134 is carried out. In the third adder 143, addition of the output signal (6 bits) of the fifth multiplier 135 and the output signal (6 bits) of the sixth multiplier 136 is carried out. In the fourth adder 144, addition of the output signal (6 bits) of the seventh multiplier 137 and the output signal (6 bits) of the eighth multiplier 138 is carried out. In the fifth adder 145, addition of the output signal (7 bits) of the first adder 141 and the output signal (7 bits) of the second adder 142 is carried out. In the sixth adder 146, addition of the output signal (7 bits) of the third adder 143 and the output signal (7 bits) of the fourth adder 144 is carried out. In the seventh adder 147, addition of the output signal (8 bits) of the fifth adder 145 and the output signal (8 bits) of the sixth adder 146 is carried out.

In this digital matched filter, a correlation value MFOUT between the digital signal $I_o$ and the despreading code sequence $C_7 \, C_6 \, C_5 \, C_4 \, C_3 \, C_2 \, C_1 \, C_0$ is obtained in the seventh adder 147, and is outputted to the outside through the output terminal 105, too. In the digital matched filter, the correlation value MFOUT can be obtained each time that the clock CLK of 8.192 MHz is inputted to the clock input terminal 102, so that the correlation value MFOUT can be obtained at a time interval which is half the time interval in the digital matched filter shown in FIG. 1.

However, the conventional digital matched filters shown in FIGS. 1 and 3 face a fatal problem that consumption power is large. Namely, in the conventional digital matched filter shown in FIG. 1, in order to obtain the correlation value MFOUT between the digital signal $I_o$ and the despreading code sequence $C_7 \, C_6 \, C_5 \, C_4 \, C_3 \, C_2 \, C_1 \, C_0$ the tapped shift register 10 including the first to seventh flip-flop sets 11–17 is used as a tapped delay line unit. As a result, the tapped shift register 10 is operated in synchronism with the clock CLK of 4.096 MHz, so that consumption power increases. In the conventional digital matched filter shown in FIG. 3, in order to obtain the correlation value MFOUT between the digital signal $I_o$ and the despreading code sequence $C_7 \, C_6 \, C_5 \, C_4 \, C_3 \, C_2 \, C_1 \, C_0$, the tapped shift register 110 including the first to fourteenth flip-flop sets 111–124 is used as a tapped delay line unit. As a result, the tapped shift register 110 is operated in synchronism with the clock CLK of 8.192 MHz, so that consumption power further increases.

In the correlation detector for the correlation detection of the spectrum spread signal in the portable telephone or the like, the correlation detection needs to be carried out for the in-phase channel and the quadrature channel, so that the correlation detector needs to be constructed by using two of the conventional digital matched filters as above. As a result, the correlation detector is constructed by using the conventional digital matched filters shown in FIG. 1 or 3, raising a problem that consumption power in the correlation detector is increased. In addition, there arises a problem that the consumption power in the correlation detector increases in proportion to an increase in the bit number of digital signal, an increase in the tap number of shift register and an increase in the number of interpolation processes.

In order to reduce the consumption power in the correlation detector, a matched filter for wide-band DS-CDMA fundamentally constructed on the basis of an analog/digital filter for performing the correlation detection through the analog signal processing has been developed (Sawahashi et al, "Low Power Consumption Matched Filter LSI for Wideband DS-CDMA", Technical Study Report of the Institute of Electronic Information Communication (Radio Communication), RCS95-120, January, 1996). The matched filter for wide-band DS-CDMA, however, uses a tapped delay unit including a plurality of sample-hold circuits inputted with an analog input signal, and a plurality of multiplication circuits for performing multiplication operations of respective output signals of the tapped delay unit by a multiplicator represented by a digital signal. Therefore, in a utilization such as the portable telephone of the spectrum spread communication system in which the digital signal processing predominantly proceeds, a digital matched filter which is totally constructed with digital circuits can be integrated more easily with peripheral circuits for digital signal processing.

Also, U.S. Pat. No. 5,396,446 discloses a digital filter circuit comprising a plurality of hold circuits which are respectively inputted with an input signal, a recursive tapped shift register for storing multiplicators, a plurality of multipliers for multiplying output signals of the plurality of hold circuits by output signals of the recursive tapped shift register, respectively, and an adder for adding output signals of the plurality of multipliers. However, the digital filter circuit is not devised with the aim of reducing consumption power as compared to the conventional digital matched filter using the tapped shift register as the tapped delay unit, but is devised with the aim of suppressing the hold error to a minimum by constructing the hold circuit through the use of two differential amplifiers, two transistors and two capacitors and controlling conduction/non-conduction of the two transistors with clocks which are in opposite phase with each other. Further, in the digital filter circuit, input data is cumulated and held in the capacitor of each hold circuit, so that the accuracy of holding the input data is degraded as compared to a case where input data is held by a digital circuit. Further, in the digital filter circuit, the hold circuit, the multiplier and the adder are constructed by using analog elements such as capacitors. Therefore, in the utilization such as the portable telephone of the spectrum spread communication system in which the digital signal processing predominantly proceeds, the digital matched filter which is totally constructed with digital circuits can be integrated more easily with peripheral circuits for digital signal processing.

SUMMARY OF THE INVENTION

An object of the present invention is to provide a digital matched filter which can be reduced in consumption power and which can be easily fabricated in the form of an LSI together with peripheral circuits for digital signal processing even when used in the portable telephone or the like.

A first digital matched filter according to the present invention is a digital matched filter for determining a correlation value between an N-bit digital signal, which is synchronous with a clock, and a digital code sequence which includes M digital codes, and comprises:

a) first to M-th digital signal storing means applied with the N-bit digital signal;

b) digital write selection means for sequentially selecting the first to M-th digital signal storing means one by one in synchronism with the clock to store the N-bit digital signal in the selected digital signal storing means;

c) a recursive shift register for digital code sequence having first to M-th stages of code flip-flops connected in cascade, and being operative in synchronism with the clock, wherein the M digital codes are stored in the first to M-th stages of code flip-flops, respectively, and an output terminal of the M-th stage of code flip-flop is connected to an input terminal of the first stage of code flip-flop;

d) first to M-th digital multiplication means for multiplying output signals of the first to M-th digital signal storing means by output signals of the first to M-th stages of code flip-flops, respectively; and e) digital addition means for adding output signals of the first to M-th digital multiplication means.

In the M-times spread M-order digital matched filter constructed by using a FIR digital filter, the digital signal having a large bit number is not shifted in synchronism with the clock, but the digital code is shifted in synchronism with the clock to determine a correlation value between the two. As a result, the first digital matched filter according to the present invention can greatly reduce consumption power during storage of the digital signal as compared to the conventional digital matched filter in which the digital code is not shifted in synchronism with the clock but the digital signal having the large bit number is shifted in synchronism with the clock.

A second digital matched filter according to the present invention is a digital matched filter for determining a correlation value between an N-bit digital signal, which is over-sampled by a first clock having a frequency which is m-times as large as a second clock, and a digital code sequence which includes M digital codes, and comprises:

a) m×M digital signal storing means applied with the N-bit digital signal;

b) digital write selecting means for sequentially selecting the m×M digital signal storing means one by one in synchronism with the first clock to store the N-bit digital signal in the selected digital signal storing means;

c) first to M-th digital selection means dividing the m×M digital signal storing means by m to divide the m×M digital signal storing means into M blocks to sequentially select and output output signals of the m digital signal storing means included in the M blocks within one period of the second clock;

d) a recursive shift register for digital code sequence having first to M-th stages of code flip-flops which are connected in cascade, and being operative in synchronism with the second clock, wherein the M digital codes are stored in the first to M-th staged of code flip-flops, respectively, and an output terminal of the M-th stage of code flip-flop is connected to an input terminal of the first stage of code flip-flop;

e) first to M-th digital multiplication means for multiplying output signals of the first to M-th digital selection means by output signals of the first to M-th stages of code flip-flops, respectively; and f) digital addition means for adding output signals of the first to M-th digital multiplication means.

In the M-times spread (m×M)-order digital matched filter constructed by using an FIR m-times over-sampling interpolation digital filter, the digital signal having a large bit number is not shifted in synchronism with the clock, but the digital code is shifted in synchronism with the clock to determine a correlation value between the two. As a result, the second digital matched filter according to the present invention can greatly reduce consumption power during storage of the digital signal as compared to the conventional digital matched filter in which the digital code is not shifted in synchronism with the clock but the digital signal having the large bit number is shifted in synchronism with the clock.

A third digital matched filter according to the present invention is a digital matched filter for determining a correlation value between an N-bit digital signal, which is over-sampled by a first clock having a frequency which is m-times as large as a second clock, and a digital code sequence which includes M digital codes, and comprises:

a) serial/parallel conversion means for serial/parallel converting the digital signal serially inputted to output first to m-th digital signals in parallel;

b) first to m-th digital signal storage means applied with the first to m-th digital signals from the serial/parallel conversion means, respectively, and having each M memory units;

c) digital write selection means for sequentially selecting the M memory units one by one in synchronism with the second clock every the first to m-th digital storage means to store the respective first to M-th digital signals in the respective selected memory units;

d) first to M-th digital selection means for sequentially selecting and outputting output signals of the first to m-th digital signal storing means within one period of the second clock every the M memory units, respectively;

e) a recursive shift register for digital code sequence having first to M-th stages of code flip-flops which are connected in cascade, and being operative in synchronism with the second clock, wherein the M digital codes are stored in the first to M-th stages of code flip-flops, respectively, and an output terminal of the M-th stage of code flip-flop is connected to an input terminal of the first stage of code flip-flop;

f) first to M-th digital multiplication means for multiplying output signals of the first to M-th digital selection means by output signals of the first to M-th stages of code flip-flops, respectively; and g) digital addition means for adding output signals of the first to M-th digital multiplication means.

The third digital matched filter according to the present invention uses m M-times spread M-order digital matched filters each constructed by using a FIR digital filter, and when correlation between the digital signal over-sampled by the first clock having a frequency which is m-times the second frequency and the digital code is determined, each of the digital signals having a large bit number is not shifted in synchronism with the clock but the digital code is shifted in synchronism with the clock to determine a correlation value between the two. As a result, consumption power during storage of the digital signal can be reduced greatly as compared to the conventional digital matched filter in which the digital code is not shifted in synchronism with the clock but each of the digital signals having the large bit number is shifted in synchronism with the clock to determine a correlation value between the two.

BEST MODE FOR CARRYING OUT THE INVENTION (First Embodiment)

Figure 4:
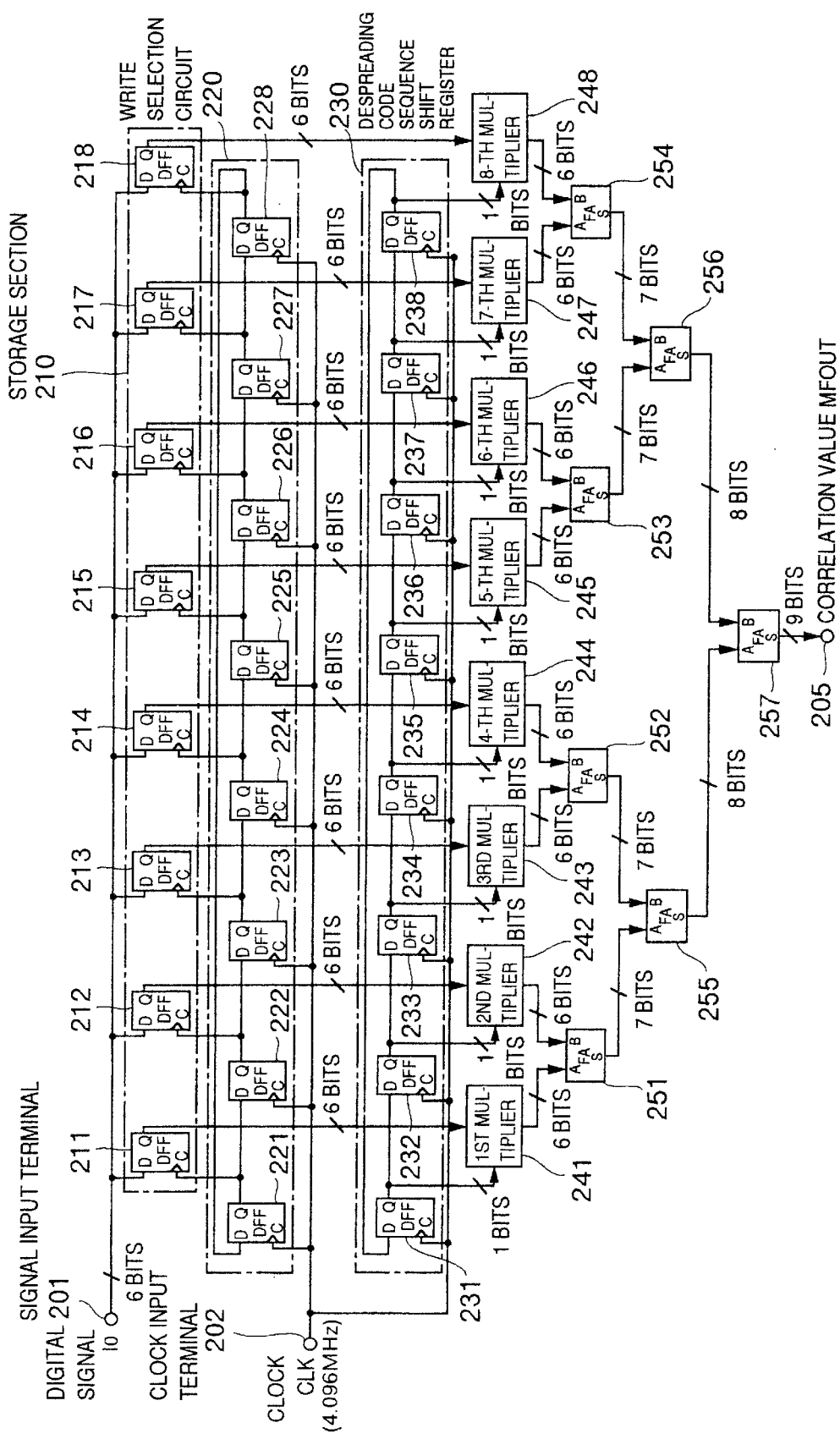
FIG. 4 is a block diagram showing a digital matched filter according to a first embodiment of the present invention.

A digital matched filter according to a first embodiment of the present invention is an eight-times spread 8-order digital matched filter constructed by using an FIR digital filter. As shown in FIG. 4, it comprises a signal input terminal 201, a clock input terminal 202, a storage section 210 including first to eighth flip-flop sets 211–218, a write selection circuit 220 constructed by using a recursive tapped shift register including first to eighth write selecting flip-flops 221–228, a despreading code sequence shift register 230 constructed by using a recursive tapped shift register including first to eighth despreading code flip-flops 231–238, first to eighth multipliers 241–248, first to seventh adders 251–257, and an output terminal 205. Here, each of the first to eighth flip-flop sets 211–218 constituting the storage section 210 is comprised of 6 flip-flops connected in parallel to each other.

A digital signal $I_o$ generated by sampling an analog signal (for example, a spectrum spread signal) at a sampling frequency of 4.096 MHz is inputted to the signal input terminal 201. The digital signal $I_o$ is a 6-bit digital signal in terms of two's complement which is synchronous with a clock CLK of 4.096 MHz inputted to the clock input terminal 202.

Data input terminals D of the first to eighth flip-flop sets 211–218 constituting the storage section 210 are applied with the digital signal $I_o$. Clock input terminals C of the first to eighth flip-flop sets 211–218 are applied with output signals of the first to eighth write selecting flip-flops 221–228 constituting the write selection circuit 220, respectively.

In the initial state, desired one of the first to eighth write selecting flip-flops 221–228 constituting the write selection circuit 220 is written with "1" (high level in logical value), and the other write selecting flip-flops are written with "0", (low level in logical value). Hereinafter, for simplification of explanation, it is assumed that only the eighth write selecting flip-flop 228 is written with "1" in the initial state. Clock input terminals C of the first to eighth write selecting flip-flops 221–228 are applied with the clock CLK. When the clock CLK is applied to the clock input terminal C of the eighth write selecting flip-flop 228, the "1" which has been written to the eighth write selecting flip-flop 228 in the initial condition is shifted to the first write selecting flip-flop 221. Subsequently, the "1" shifted to the first write selecting flip-flop 221 is sequentially shifted from the second write selecting flip-flop 222 toward the eighth write selecting flip-flop 228 in synchronism with the clock CLK. Thereby, the "1" is sequentially applied to the clock input terminals C of the first to eighth flip-flop sets 211–218 constituting the storage section 210 in synchronism with the clock CLK, so that the digital signal $I_o$ is sequentially fetched and held in the first to eighth flip-flop sets 211–218 in synchronism with the clock CLK.

The first to eighth despreading code sequence flip-flops 231–238 constituting the despreading code sequence shift register 230 are written with despreading codes of an 8-bit despreading code sequence $C_7$ $C_6$ $C_5$ $C_4$ $C_3$ $C_2$ $C_1$ $C_0$ respectively. Hereinafter, for simplification of explanation, it is assumed that in the initial state, the despreading codes $C_0$–$C_7$ are stored in the first to eighth despreading code flip-flops 231–238 in order of from the despreading code $C_7$ to the despreading code $C_0$, respectively.

Clock input terminals C of the first to eighth despreading code flip-flops 231–238 are applied with the clock CLK, and the despreading codes $C_0$–$C_7$ stored in the first to eighth despreading code flip-flops 231–238 are sequentially shifted from the first despreading code flip-flop 231 toward the eighth despreading code flip-flop 238 in synchronism with the clock CLK. It is to be noted that a despreading code which has been shifted to the eighth despreading code flip-flop 238 is shifted to the first despreading code flip-flop 231 in synchronism with the next clock CLK. Thereby, the despreading codes $C_0$–$C_7$ are outputted from the first to eighth despreading code flip-flops 231–238 while being sequentially shifted in synchronism with the clock CLK.

Each of the first to eighth multipliers 241–248 is a multiplier for 6 bits×1 bit, and outputs an output signal of 6 bits. In the first to eighth multipliers 241–248, multiplication operations of output signals (6 bits) of the first to eighth flip-flop sets 211–218 by the despreading codes (1 bit) outputted from the first to eighth despreading code flip-flops 231–238 are carried out, respectively. For example, in the multipliers 241–248, when the despreading code indicates "1", multiplication operations of the output signals of the first to eighth flip-flop sets 211–218 by "1" are carried out. When the despreading code indicates "0", multiplication operations of the output signals of the first to eighth flip-flop sets 211–218 by "−1", are carried out.

Figure 5:
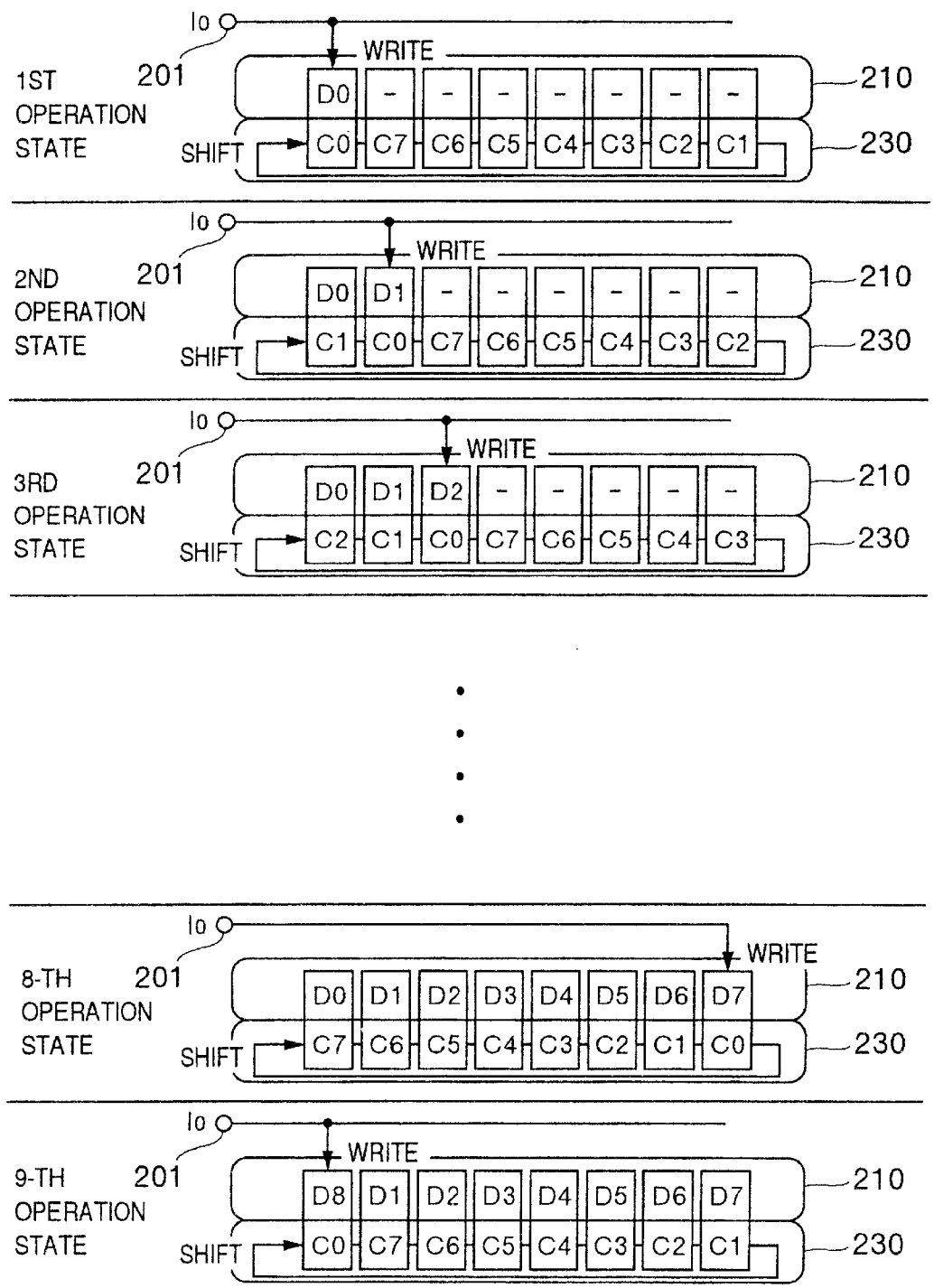
FIG. 5 is a diagram for explaining the procedure for multiplication in the digital matched filter shown in FIG. 4.

The procedure for multiplication in the respective multipliers 241–248 will be described hereunder with reference to FIG. 5.

In the first operation state, a first sampling data $D_0$ of the digital signal $I_o$ is inputted to the signal input terminal 201 in synchronism with the clock CLK. At the same time, the "1" which has been written in the eighth write selecting flip-flop 228 of the write selection circuit 220 in the initial state is shifted to the first write selecting flip-flop 221 in synchronism with the clock CLK. As a result, the "1" is applied to the clock input terminal C of only the first shift register set 211 of the storage section 210, and the first sampling data $D_0$ is fetched and held in the first shift register set 211. Also, the despreading code $C_0$ which has been stored in the eighth despreading code flip-flop 238 of the despreading code string shift register 230 in the initial state is shifted to the first despreading code flip-flop 231 in synchronism with the clock CLK. As a result, multiplication of the first sampling data $D_0$ by the despreading code $C_0$ is carried out in the first multiplier 241. Accordingly, an output signal indicative of a value of $D_0 \times C_0$ is outputted from the first multiplier 241.

In the second operation state, a second sampling data $D_1$ of the digital signal $I_o$ is inputted to the signal input terminal 201 in synchronism with the clock CLK. At the same time, the "1" which has been shifted to first write selecting flip-flop 221 of the write selection circuit 220 in the first operation state is shifted to the second write selecting flip-flop 222 in synchronism with the clock CLK. As a result, the "1" is applied to the clock input terminal C of only the second shift register set 212 of the storage section 210, and the second sampling data $D_1$ is fetched and held in the second shift register set 212. At that time, in the first flip-flop set 211, the first sampling data $D_0$ which has been fetched thereto in the first operation state is held as it is. Also, the despreading codes stored in the despreading code string shift register 230 are shifted in synchronism with the clock CLK. As a result, the despreading code $C_0$ which has been shifted to the first despreading code flip-flop 231 in the first operation state is shifted to the second despreading code flip-flop 232, and the despreading code $C_1$ which has been shifted to the eighth despreading code flip-flop 238 in the first operation state is shifted to the first despreading code flip-flop 231. Consequently, multiplication of the second sampling data $D_1$ by the despreading code $C_0$ is carried out in the second multiplier 242, and multiplication of the first sampling data $D_0$ by the despreading code $C_1$ is carried out in the first multiplier 241. Accordingly, an output signal indicative of a value of $D_1 \times C_0$ is outputted from the second multiplier 242, and an output signal indicative of a value of $D_0 \times C_1$ is outputted from the first multiplier 241.

In the third operation state, a third sampling data $D_2$ of the digital signal $I_o$ is inputted to the signal input terminal 201 in synchronism with the clock CLK. At the same time, the "1" which has been shifted to the second write selecting flip-flop 222 of the write selection circuit 220 in the second operation state is shifted to the third write selecting flip-flop 223 in synchronism with the clock CLK. As a result, the "1" is applied to the clock input terminal C of only the third shift register set 213 of the storage section 210, and the third sampling data $D_2$ is fetched and held in the third shift register set 213. At that time, in the first flip-flop set 211, the first sampling data $D_0$ which has been fetched thereto in the first operation state is held as it is, and in the second flip-flop set 212, the second sampling data $D_1$ which has been fetched thereto in the second operation state is held as it is. Also, the despreading codes stored in the despreading code sequence shift register 230 are shifted in synchronism with the clock CLK. Consequently, the despreading code $C_0$ which has been shifted to the second despreading code flip-flop 232 in the second operation state is shifted to the third despreading code flip-flop 233, the despreading code $C_1$ which has been shifted to the first despreading code flip-flop 231 in the second operation state is shifted to the second despreading code flip-flop 232, and the despreading code $C_2$ which has been shifted to the eighth despreading code flip-flop 238 in the second operation state is shifted to the first despreading code flip-flop 231. As a result, multiplication of the third sampling data $D_2$ by the despreading code $C_0$ is carried out in the third multiplier 243, multiplication of the second sampling data $D_1$ by the despreading code $C_1$ is carried out in the second multiplier 242, and multiplication of the first sampling data $D_0$ by the despreading code $C_2$ is carried out in the first multiplier 241. Accordingly, an output signal indicative of a value of $D_2 \times C_0$ is outputted from the third multiplier 243, an output signal indicative of a value of $D_1 \times C_1$ is outputted from the second multiplier 242, and an output signal indicative of a value of $D_0 \times C_2$ is outputted from the first multiplier 241. Subsequently, a similar operation is repeated until the seventh operation state.

In the eighth operation state, an eighth sampling data $D_7$ of the digital signal $I_o$ is inputted to the signal input terminal 201 in synchronism with the clock CLK. At the same time, the "1" which has been shifted to the seventh write selecting flip-flop 227 of the write selection circuit 220 in the seventh operation state is shifted to the eighth write selecting flip-flop 228 in synchronism with the clock CLK. As a result, the "1" is applied to the clock input terminal C of only the eighth shift register set 218 of the storage section 210, and the eighth sampling data $D_7$ is fetched and held in the eighth shift register set 218. At that time, in the first to seventh flip-flop sets 211–217, the first to seventh sampling data $D_0$–$D_6$ which have been fetched thereto up to the seventh operation state are held as they are, respectively. Also, the despreading codes stored in the despreading code sequence shift register 230 are shifted in synchronism with the clock CLK, so that the despreading codes $C_7$–$C_0$ are stored in the first to eighth despreading code flip-flops 231–238, respectively. Thereby, multiplication operations of the first to eighth sampling data $D_0$–$D_7$ of digital signal $I_o$, which are respectively held in the first to eighth flip-flops 211–218 of the storage section 210, by the despreading codes $C_7$–$C_0$ which are respectively shifted to the first to eighth despreading code sequence flip-flops 231–238 of the despreading code sequence shift register 230 are carried out in the first to eighth multipliers 241–248, respectively. As a result, an output signal indicative of a value of $D_7 \times C_0$ is outputted from the eighth multiplier 248, an output signal indicative of a value of $D_6 \times C_1$ is outputted from the seventh multiplier 247, an output signal indicative of a value of $D_5 \times C_2$ is outputted from the sixth multiplier 246, an output signal indicative of a value of $D_4 \times C_3$ is outputted from the fifth multiplier 245, an output signal indicative of a value of $D_3 \times C_4$ is outputted from the fourth multiplier 244, an output signal indicative of a value of $D_2 \times C_5$ is outputted from the third multiplier 243, an output signal indicative of a value of $D_1 \times C_6$ is outputted from the second multiplier 242, and an output signal indicative of a value of $D_0 \times C_7$ is outputted from the first multiplier 241.

Through the above operation, multiplication operations necessary to determine a correlation value between the initial 8-sampling data $D_7$ $D_6$ $D_5$ $D_4$ $D_3$ $D_2$ $D_1$ $D_0$ of the digital signal $I_o$ and the 8-bit despreading code sequence $C_7$ $C_6$ $C_5$ $C_4$ $C_3$ $C_2$ $C_1$ C. are all carried out.

In the ninth operation state, a ninth sampling data $D_8$ of the digital signal $I_o$ is inputted to the signal input terminal 201 in synchronism with the clock CLK. At the same time, the "1" which has been shifted to the eighth write selecting flip-flop 228 of the write selection circuit 220 in the eighth operation state is shifted to the first write selecting flip-flop 221 in synchronism with the clock CLK. As a result, the "1" is applied to the clock input terminal C of only the first shift register set 211 of the storage section 210, and the ninth sampling data $D_8$ is fetched and held in the first shift register set 211. At that time, in the second to eighth flip-flop sets 211–218, the second to eighth sampling data $D_1$–$D_7$ which have been fetched thereto up to the eighth operation state are held as they are, respectively. Also, the despreading codes stored in the despreading code sequence shift register 230 are shifted in synchronism with the clock CLK. Consequently, the despreading code $C_0$ is stored in the first despreading code flip-flop 231, and the despreading codes $C_7$–$C_1$ are stored in the second to eighth despreading code flip-flops 232–238, respectively. Thereby, multiplication of the ninth sampling data $D_8$ of the digital signal $I_o$ held in the first flip-flop 211 of the storage section 210 by the despreading code $C_0$ stored in the first despreading code flip-flop 231 of the despreading code sequence shift register 230 is carried out in the first multiplier 241, and multiplication operations of the second to eighth sampling data pieces $D_1$–$D_7$ of the digital signal $I_o$, which are respectively held in the second to ninth flip-flops 212–218, by the despreading codes $C_7$–$C_1$ which are respectively stored in the second to eighth despreading code flip-flops 231–238 of the despreading code sequence shift register 230 are carried out in the second to eighth multipliers 242–248, respectively. As a result, an output signal indicative of a value of $D_8 \times C_0$ is outputted from the first multiplier 241, an output signal indicative of a value of $D_7 \times C_1$ is outputted from the eighth multiplier 248, an output signal indicative of a value of $D_6 \times C_2$ is outputted from the seventh multiplier 247, an output signal indicative of a value of $D_5 \times C_3$ is outputted from the sixth multiplier 246, an output signal indicative of a value of $D_4 \times C_4$ is outputted from the fifth multiplier 245, an output signal indicative of a value of $D_3 \times C_5$ is outputted from the fourth multiplier 244, an output signal indicative of a value of $D_2 \times C_6$ is outputted from the third multiplier 243, and an output signal indicative of a value of $D_1 \times C_7$ is outputted from the second multiplier 242.

Consequently, multiplication operations necessary to determine a correlation value between the 8-sampling data $D_8$ $D_7$ $D_6$ $D_5$ $D_4$ $D_3$ $D_2$ $D_1$ of digital signal $I_o$ which is one sampling after the initial 8-sampling data $D_7$ $D_6$ $D_5$ $D_4$ $D_3$ $D_2$ $D_1$ $D_0$ and the 8-bit despreading code string $C_7$ $C_6$ $C_5$ $C_4$ $C_3$ $C_2$ $C_1$ $C_0$ are all carried out. Subsequently, a similar operation is repeated.

Each of the first to fourth adders 251–254 is an adder for 6 bits+6 bits, and outputs an output signal of 7 bits. Each of the fifth and sixth adders 255 and 256 is an adder for 7 bits+7 bits, and outputs an output signal of 8 bits. The seventh adder 257 is an adder for 8 bits +8 bits, and outputs an output signal of 9 bits. In the first adder 251, addition of the output signal (6 bits) of the first multiplier 241 and the output signal (6 bits) of the second multiplier 242 is carried out. In the second adder 252, addition of the output signal (6 bits) of the third multiplier 243 and the output signal (6 bits) of the fourth multiplier 244 is carried out. In the third adder 253, addition of the output signal (6 bits) of the fifth multiplier 255 and the output signal (6 bits) of the sixth multiplier 256 is carried out. In the fourth adder 254, addition of the output signal (6 bits) of the seventh multiplier 247 and the output signal (6 bits) of the eighth multiplier 248 is carried out. In the fifth adder 255, addition of the output signal (7 bits) of the first adder 251 and the output signal (7 bits) of the second adder 252 is carried out. In the sixth adder 256, addition of the output signal (7 bits) of the third adder 253 and the output signal (7 bits) of the fourth adder 254 is carried out. In the seventh adder 257, addition of the output signal (8 bits) of the fifth adder 255 and the output signal (8 bits) of the sixth adder 256 is carried out. As a result, a correlation value MFOUT between the digital signal $I_o$ and the despreading code sequence $C_7$ $C_6$ $C_5$ $C_4$ $C_3$ $C_2$ $C_1$ $C_0$ is obtained in the seventh adder 257, and is outputted to the outside through the output terminal 205.

Next, comparison of consumption power in the digital matched filter according to the present embodiment with that in the conventional digital matched filter shown in FIG. 1 will be described. In the digital matched filter according to the present embodiment, write of the digital signal $I_o$ to the storage section 210 at each clock CLK is carried out at only one of the first to eighth flip-flop sets 211–218. Accordingly, on the assumption that consumption power in one flip-flop constituting the respective flip-flop sets 211–218 is W, consumption power in the storage section 210 is 6 W. Also, in the digital matched filter according to the present embodiment, the first to eighth write selecting flip-flops 221–228 constituting the write selection circuit 220 and the first to eighth despreading code flip-flops 231–238 constituting the despreading code sequence shift register 230 operate in synchronism with the clock CLK. Hence, consumption power in the write selection circuit 220 and despreading code sequence shift register 230 is 2×8 W=16 W. Accordingly, consumption power in the storage section 210, write selection circuit 220 and despreading code sequence shift register 230 of the digital matched filter according to the present embodiment amounts up to 6 W+16 W=22 W. Contrary to this, in the conventional digital matched filter shown in FIG. 1, all of the first to seventh flip-flop sets 11–18 are operated in synchronism with the clock CLK when the digital signal $I_o$ is written to the tapped shift register 10 at each clock CLK. Hence, consumption power in the tapped shift register 10 is 6×7 W=42 W. Accordingly, as consumption power in the first to eighth multipliers 241–248 and first to seventh adders 251–257 of the digital matched filter according to the present embodiment is identical to that in the first to eighth multipliers 21–28 and first to seventh adders 31–37 of the conventional digital matched filter shown in FIG. 1, the consumption power in the digital matched filter according to the present embodiment is 22 W/42 W≈1/2 as compared to the consumption power in the conventional digital matched filter shown in FIG. 1.

Generally, given that the number of bits of the digital signal $I_o$ is N in an M-times spread M-order digital matched filter, each of the flip-flop sets of the storage section 210 includes N flip-flops, and each of the write selection circuit 220 and despreading code sequence shift register 230 includes M flip-flops in the digital matched filter according to the present embodiment. Accordingly, consumption power in the storage section 210, write selection circuit 220 and despreading code sequence shift register 230 of the digital matched filter according to the present embodiment is NW+MW+MW=(N+M+M)W. Contrary to this, in the conventional digital matched filter shown in FIG. 1, the tapped shift register 10 includes (M−1)N flip-flops, so that consumption power in the tapped shift register 10 is (M−1)NW. Accordingly, the consumption power in the digital matched filter according to the present embodiment is (N+M+M)W/(M−1)NW=(N+M+M)/(M−1)N as compared to the consumption power in the conventional digital matched filter shown in FIG. 1. As M>>1 is generally satisfied, the consumption power in the digital matched filter according to the present embodiment is 1/M+1/N+1/N as compared to the consumption power in the conventional digital matched filter shown in FIG. 1.

In the foregoing description, each despreading code constituting the despreading code sequence $C_7$ $C_6$ $C_5$ $C_4$ $C_3$ $C_2$ $C_1$ $C_0$ is of 1 bit. However, the number of bits of each despreading code constituting the despreading code sequence of $C_7$ $C_6$ CS $C_4$ $C_3$ $C_2$ $C_1$ $C_0$ may sometimes be two or more (provided that the bit number of each despreading code is smaller than that of the digital signal $I_o$). For example, each despreading code may be of 2 bits to indicate 1, 0, −1. When the bit number of each despreading code is two or more, a despreading code sequence shift register constructed of a recursive tapped shift register using 8 flip-flop sets each including two or more flip-flops connected in parallel to each other may be used in place of the despreading code sequence shift register 230 shown in FIG. 4.

Each of the first to eighth multipliers 241–248 may not necessarily be a multiplier constructed of a logical circuit, and may be means for outputting the same multiplication result (for example, a circuit which outputs an input signal as it is when the despreading code is "1", and which inverts the code bit of the input signal and outputs a resulting signal when the despreading code is "0" (multiplication of coefficient "−1")).

(Second Embodiment)

Figure 6:
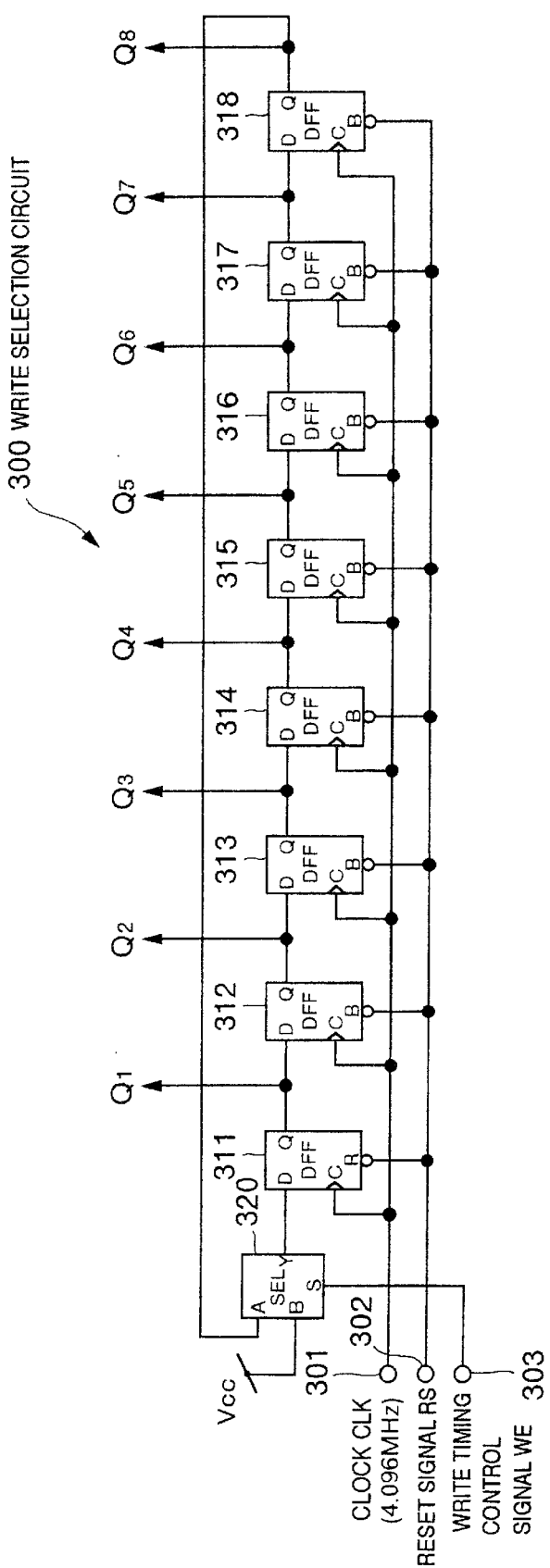
FIG. 6 is a block diagram showing a write selection circuit provided in a digital matched filter according to a second embodiment of the present invention.

A digital matched filter according to a second embodiment of the present invention differs from the previously-described digital matched filter according to the first embodiment in that it comprises a write selection circuit 300 shown in FIG. 6 in place of the write selection circuit 220 shown in FIG. 4.

As shown in FIG. 6, the write selection circuit 300 provided in the digital matched filter according to the present embodiment is constructed by using a recursive tapped shift register including first to eighth write selecting flip-flops 311–318 and a selector circuit 320. Clock input terminals C of the first to eighth write selecting flip-flops 311–318 are applied with a clock CLK of 4.096 MHz through a clock input terminal 301. Reset terminals R of the first to eighth write selecting flip-flops 311–318 are applied with a reset signal RS through a reset signal input terminal 302. A first input terminal A of the selector circuit 320 is applied with an output signal $Q_8$ of the eighth write selecting flip-flop 318. A second input terminal B of the selector circuit 320 is applied with power supply voltage Vcc (voltage corresponding to high level in logical value). A selection terminal S of the selection circuit 320 is applied with a write timing control signal WE through a timing control signal input terminal 303. An output terminal Y of the selector circuit 320 is connected to a data input terminal D of the first write selecting flip-flop 311. It is to be noted that in the selector circuit 320, the second input terminal B is selected when the write timing control signal WE is "1" (high level in logical value), and the first input terminal A is selected when the write timing control signal WE is "0" (low level in logical value).

Figure 7:
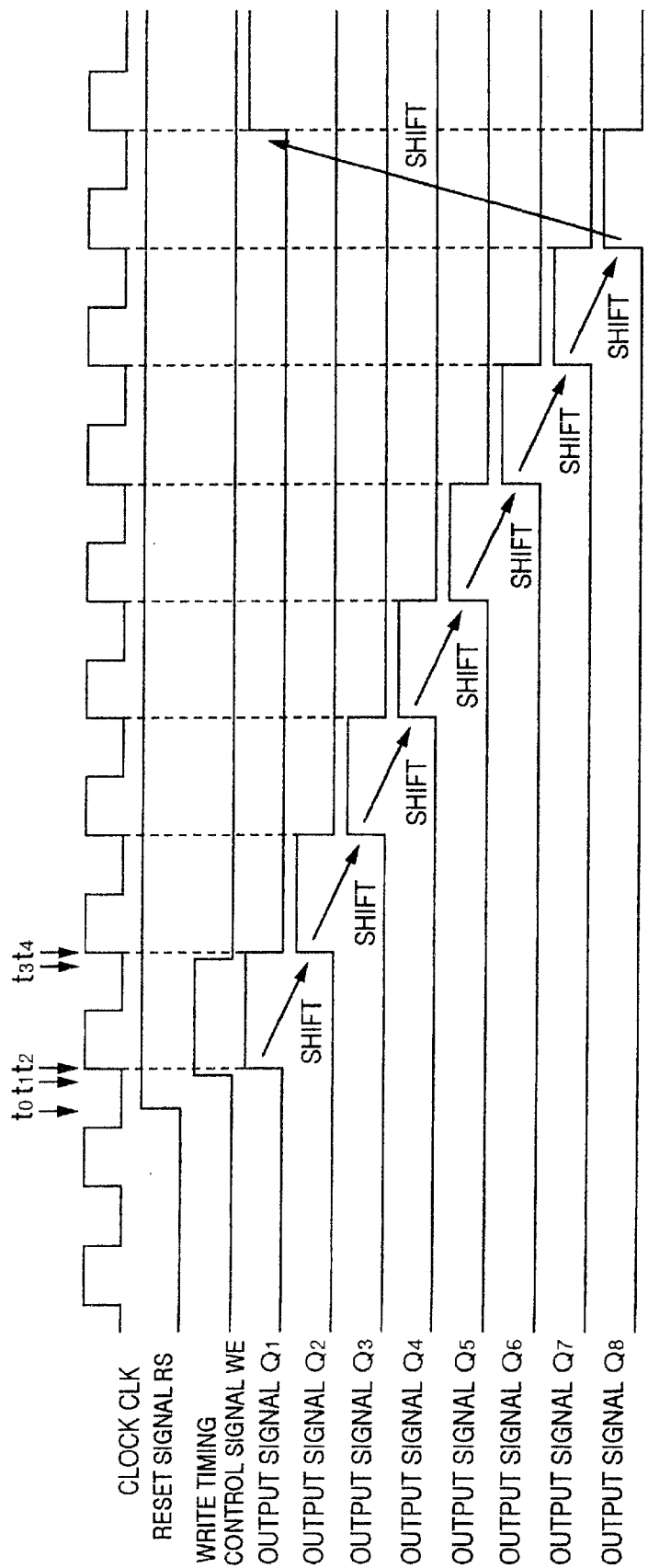
FIG. 7 is a timing chart for explaining the operation of the write selection circuit shown in FIG. 6.

Next, operation of the write selection circuit 300 will be described with reference to a timing chart shown in FIG. 7. At time preceding time $t_0$, the reset signal RS is "0", so that the first to eighth write selecting flip-flops 311–318 are all reset and output signals $Q_1$–$Q_8$ of the first to eighth write selecting flip-flops 311–318 are all rendered to be "0". When the write timing control signal WE is rendered to be "1" at time $t_1$ after the reset signal RS is rendered to be "1" at time $t_0$, the second input terminal B is selected in the selector circuit 320, and the output signal outputted from the output terminal Y of the selector circuit 320 is rendered to be "1". As a result, with the clock CLK changed from "0" to "1" at time $t_2$, the output signal of the selector circuit 320 is fetched and held in the first write selecting flip-flop 311, rendering output signal $Q_1$ of the first write selecting flip-flop 311 to be "1". At that time, output signals $Q_1$–$Q_7$ (all zero) of first to seventh write selecting flip-flops 311–317 at time t, are fetched and held in the second to eighth write selecting flip-flops 312–318, respectively, so that output signals $Q_2$–$Q_8$ of the second to eighth write selecting flip-flops 312–318 remain to be "0".

When the write timing control signal WE is rendered to be "0" at time $t_3$, the first input terminal A is selected in the selector circuit 320 and the output signal $Q_8$ of the eighth write selecting flip-flop 318 is outputted from the output terminal Y of the selector circuit 320. As a result, with the clock CLK changed from "0" to "1" at time $t_4$, the output signal Q. of the eighth write selecting flip-flop 318 is fetched and held in the first write selecting flip-flop 311, rendering the output signal $Q_1$ of the first write selecting flip-flop 311 to be "0". The output signal $Q_1$ of the first write selecting flip-flop 311 at time $t_3$ is fetched and held in the second write selecting flip-flop 312, so that the output signal $Q_2$ of the second write selecting flip-flop 312 is rendered to be "1". The output signals $Q_2$–$Q_7$ of the second to seventh write selecting flip-flops 312–317 at time $t_3$ are fetched and held in the third to eighth write selecting flip-flops 313–318, respectively, so that the output signals $Q_3$–$Q_8$ of the third to eighth write selecting flip-flops 313–318 remain to be "0". Subsequently, a similar operation is repeated. Consequently, as shown in FIG. 6, the "1" fetched and held in the first write selecting flip-flop 311 at time t2 is shifted from the first write selecting flip-flop 311 to the eighth write selecting flip-flop 318 in synchronism with the clock CLK. Further, the "1" fetched and held in the eighth write selecting flip-flop 318 is shifted to the first write selecting flip-flop 311 in synchronism with the clock CLK.

Figure 1:
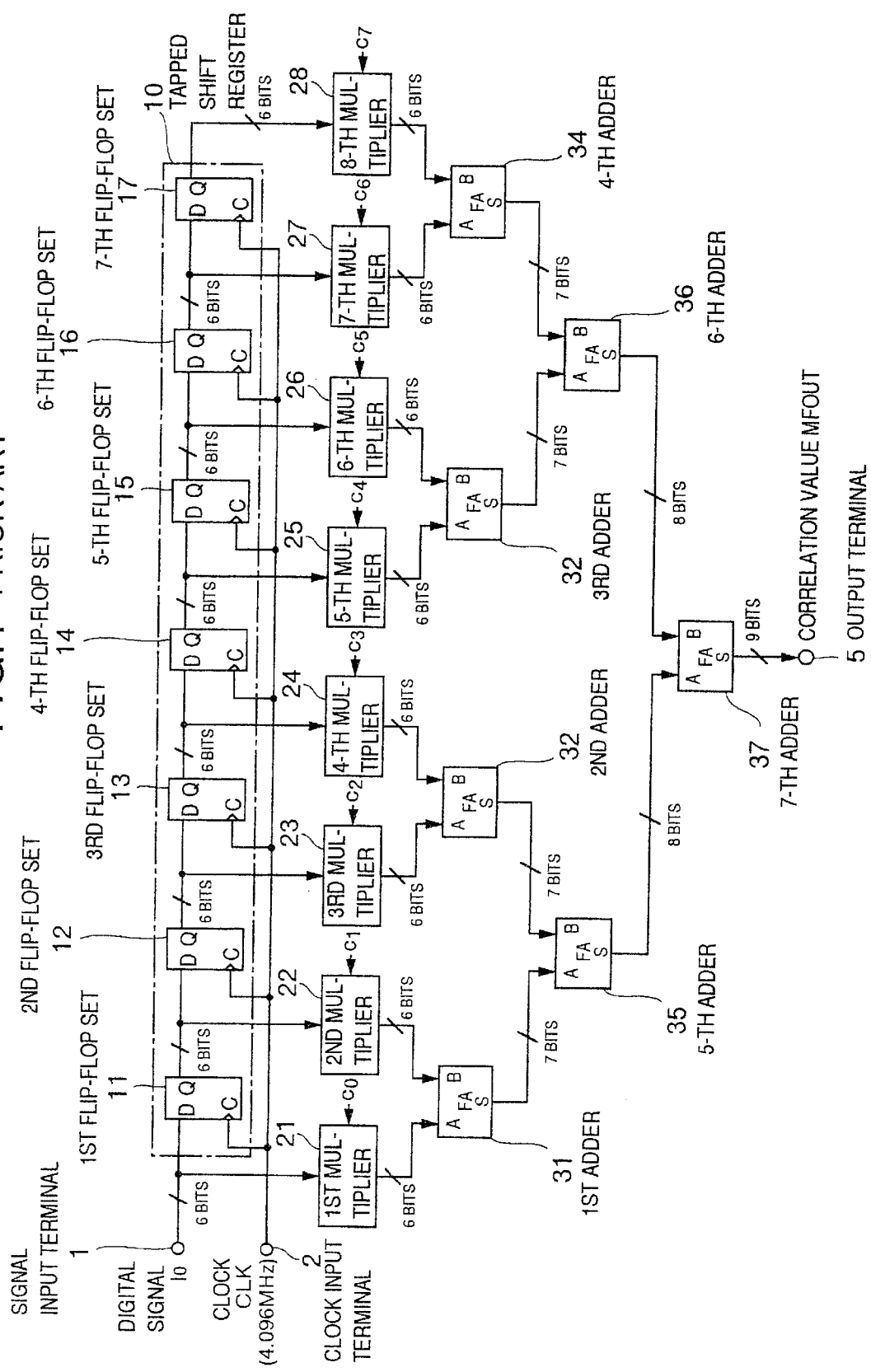
FIG. 1 is a block diagram showing a conventional example of an eight-times spread 8-order digital matched filter constructed by using an FIR digital filter.
Figure 2:
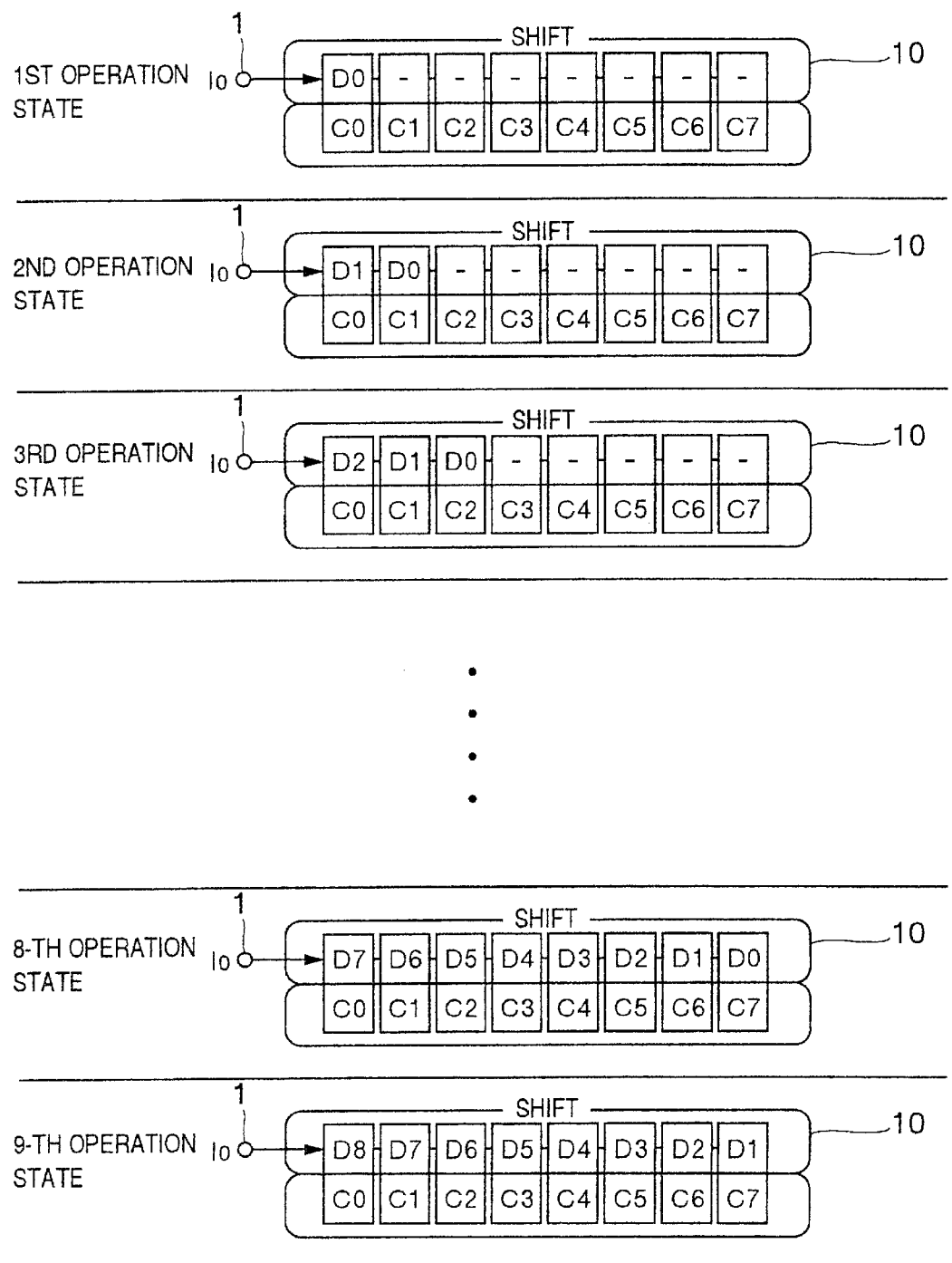
FIG. 2 is a diagram for explaining the procedure for multiplication in the digital matched filter shown in FIG. 1.

Consumption power in the digital matched filter according to the present embodiment can be reduced as compared to consumption power in the conventional digital matched filter shown in FIG. 1. Because only consumption power in the selector circuit 320 is added to the consumption power in the previously-described digital matched filter according to the first embodiment.

(Third Embodiment)

Figure 8:
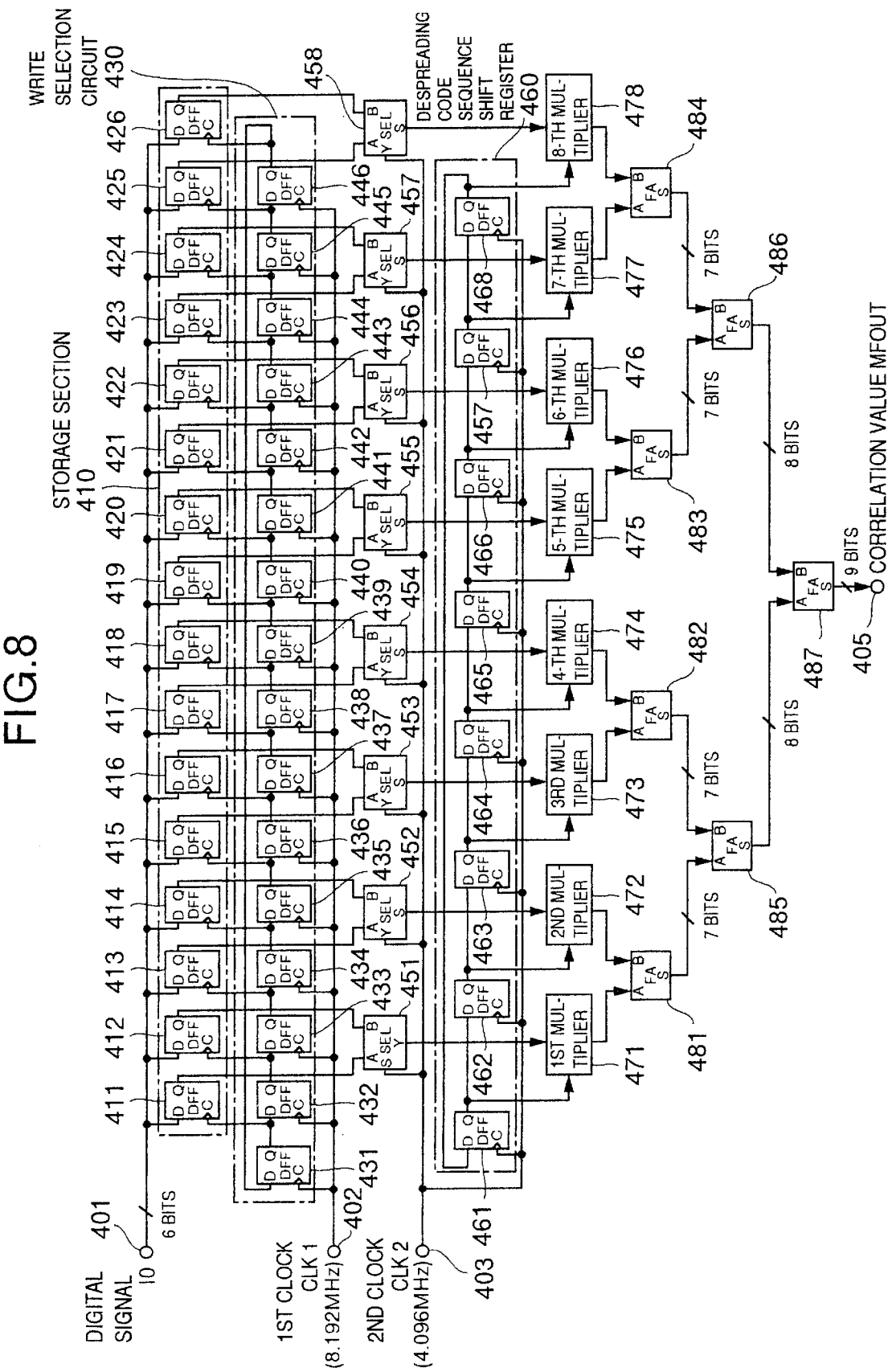
FIG. 8 is a block diagram showing a digital matched filter according to a third embodiment of the present invention.

A digital matched filter according to a third embodiment of the present invention is an eight-times spread 16-order digital matched filter constructed by using an FIR 2-times over-sampling interpolation digital filter. As shown in FIG. 8, it comprises a signal input terminal 401, a first clock input terminal 402, a second clock input terminal 403, a storage section 410 including first to sixteenth flip-flop sets 411–426, a write selection circuit 430 constructed by using a recursive tapped shift register including first to sixteenth write selecting flip-flops 431–446, first to eighth selector circuit sets 451–458, a despreading code sequence shift register 460 constructed by using a recursive tapped shift register including first to eighth despreading code flip-flops 461–468, first to eighth multipliers 471–478, first to seventh adders 481–487, and an output terminal 405. Here, each of the first to sixteenth flip-flop sets 411–426 constituting the storage section 410 includes 6 flip-flops connected in parallel to each other. Also, each of the first to eighth selector circuit sets 451–458 includes 6 selector circuits connected in parallel to each other.

A digital signal $I_o$ generated by doubly over-sampling an analog signal (spectrum spread signal) at a sampling frequency of 8.192 MHz is inputted to the signal input terminal 401. The digital signal $I_o$ is a 6-bit digital signal in terms of two's complement which is synchronous with a first clock CLK1 of 8.192 MHz inputted to the first clock input terminal 402. Data input terminals D of the first to sixteenth flip-flop sets 411–426 constituting the storage section 410 are applied with the digital signal $I_o$. Clock input terminals C of the first to sixteenth flip-flop sets 411–426 are applied with output signals of the first to sixteenth write selecting flip-flops 431–446 constituting the write selection circuit 430, respectively.

In the initial state, desired one of the first to sixteenth write selecting flip-flops 431–446 constituting the write selection circuit 430 is written with "1", and the other write selecting flip-flops are written with "0". Hereinafter, for simplification of explanation, it is assumed that in the initial state, the "1" is written and held in only the sixteenth write selecting flip-flop 446. Clock input terminals C of the first to sixteenth write selecting flip-flops 431–446 are applied with the first clock CLK1. With the first clock CLK1 applied to the clock input terminal C of the sixteenth write selecting flip-flop 446, the "1" held in the sixteenth write selecting flip-flop 446 is shifted to the first write selecting flip-flop 431. Subsequently, the "1" shifted to the first write selecting flip-flop 431 is shifted from the second write selecting flip-flop 432 toward the sixteenth write selecting flip-flop 446 in synchronism with the first clock CLK1. Thereby, the "1" is sequentially applied to the clock input terminals C of the first to sixteenth flip-flop sets 411–426 constituting the storage section 410 in synchronism with the first clock CLK1. Hence, the digital signal $I_o$ is sequentially fetched and held in the first to sixteenth flip-flop sets 411–426 in synchronism with the first clock CLK1.

A second clock CLK2 of 4.096 MHz is inputted to the second clock input terminal 403. Selection terminals S of the respective selector circuits constituting each of the first to eighth selector circuit sets 451–458 are applied with the second clock CLK2. When the second clock CLK2 is "1", a first input terminal A is selected. When the second clock CLK2 is "0", a second input terminal B is selected.

Accordingly, when the second clock CLK2 is "1", output signals of the odd flip-flop sets 411, 413, 415, 417, 419, 421, 423 and 425 of storage section 410 which are connected to the first input terminals A of the first to eighth selector circuit sets 451–458 are outputted from output terminals Y of the first to eighth selector circuit sets 451–458, respectively. On the other hand, when the second clock CLK2 is "0", output signals of the even flip-flop sets 412, 414, 416, 418, 420, 422, 424 and 426 of storage section 410 which are connected to the second input terminals B of the first to eighth selector circuit sets 451–458 are outputted from the output terminals Y of the first to eighth selector circuit sets 451–458, respectively.

The first to eighth despreading code flip-flops 461–468 constituting the despreading code sequence shift register 460 are written with the despreading codes of an 8-bit despreading code sequence $C_7\ C_6\ C_5\ C_4\ C_3\ C_2\ C_1\ C_0$, respectively. Hereinafter, for simplification of explanation, it is assumed that in the initial state, the despreading codes $C_0$–$C_7$ are stored in the first to eighth despreading code flip-flops 461–468 in order of from the despreading code $C_7$ to the despreading code $C_0$, respectively. Clock input terminals C of the first to eighth despreading code flip-flops 461–468 are applied with the second clock CLK2 of 4.096 MHz which is synchronous with the first clock CLK1 of 8.192 MHz, and the despreading codes stored in the first to eighth despreading code flip-flops 461–468 are shifted from the first despreading code flip-flop 461 toward the eighth despreading code flip-flop 468 in synchronism with the second clock CLK2. It is to be noted that a despreading code which has been shifted to the eighth despreading code flip-flop 468 is shifted to the first despreading code flip-flop 461 in synchronism with the next second clock CLK2. Thereby, the despreading codes $C_0$–$C_7$ are sequentially shifted in synchronism with the second clock CLK2, and outputted from the first to eighth despreading code flip-flops 461–468.

Each of the first to eighth multipliers 471–478 is a multiplier for 6 bits×1 bits, and outputs an output signal of 6 bits. In the first to eighth multipliers 471–478, multiplication operations of the output signals (6 bits) of the first to eighth selector circuit sets 451–458 by the despreading codes (1 bit) outputted from the first to eighth despreading code flip-flops 461–468 are carried out. In the multipliers 471–478, for example, when the despreading code indicates "1", multiplication operations of the output signals of the first to eighth selector circuit sets 451–458 by "1" are carried out. When the despreading code indicates "0", multiplication operations of the output signals of the first to eighth selector circuit sets 451–458 by "−1", are carried out.

Each of the first to fourth adders 481–484 is an adder for 6 bits+6 bits, and outputs an output signal of 7 bits. Each of the fifth and sixth adders 485 and 486 is an adder for 7 bits+7 bits, and outputs an output signal of 8 bits. The seventh adder 487 is an adder for 8 bits+8 bits, and outputs an output signal of 9 bits. In the first adder 481, addition of the output signal (6 bits) of the first multiplier 471 and the output signal (6 bits) of the second multiplier 472 is carried out. In the second adder 482, addition of the output signal (6 bits) of the third multiplier 473 and the output signal (6 bits) of the fourth multiplier 474 is carried out. In the third adder 483, the output signal (6 bits) of the fifth multiplier 475 and the output signal (6 bits) of the sixth multiplier 476 is carried out. In the fourth adder 484, addition of the output signal (6 bits) of the seventh multiplier 477 and the output signal (6 bits) of the eighth multiplier 478 is carried out. In the fifth adder 485, addition of the output signal (7 bits) of the first adder 481 and the output signal (7 bits) of the second adder 482 is carried out. In the sixth adder 486, addition of the output signal (7 bits) of the third adder 483 and the output signal (7 bits) of the fourth adder 484 is carried out. In the seventh adder 487, addition of the output signal (8 bits) of the fifth adder 485 and the output signal (8 bits) of the sixth adder 486 is carried out.

In the digital matched filter according to the present embodiment constructed as above, when 16 first clocks CLK1 are inputted following the initial state, the initial first to sixteenth sampling data $D_0$–$D_{15}$ of the digital signal $I_o$ are written and held in the first to sixteenth flip-flop sets 411–426 constituting the storage section 410, respectively. At the same time, the despreading codes $C_7$–$C_0$ are shifted to the first to eighth flip-flops 461–468 constituting the despreading code sequence shift register 460 and held therein, respectively. As a result, when the second clock CLK2 is "1", the odd sampling data $D_0, D_2, D_4, D_6, D_8, D_{10}, D_{12}$ and $D_{14}$ of the digital signal $I_o$ are selected by means of the first to eighth selector circuit sets 451–458, so that $D_{14}$ ($C_0+D_{12}\times C_1+D_{10}\times C_2+D_8\times C_3+D_6\times C_4+D_4\times C_5+D_2\times C_6+D_0\times C_7$ is obtained in the seventh adder 487. Consequently, a correlation value MFOUT between the odd sampling data pieces $D_0, D_2, D_4, D_6, D_8, D_{10}, D_{12}$ and $D_{14}$ of the initial 16 sampling data $D_0$–$D_{15}$ of the digital signal $I_o$ and the 8-bit despreading code sequence $C_7\ C_6\ C_5\ C_4\ C_3\ C_2\ C_1\ C_0$ is obtained and outputted to the outside through the output terminal 405. When the second clock CLK2 is "0", the even sampling data $D_1, D_3, D_5, D_7, D_9, D_{11}, D_{13}$ and $D_{15}$ of the digital signal $I_o$ are selected by means of the first to eighth selector circuit sets 451–458, so that $D_{15}$ ($C_0+D_{13}\times C_1+D_{11}\times C_2+D_9\times C_3+D_7\times C_4+D_5\times C_5+D_3\times C_6+D_1\times C_7$ is obtained in the seventh adder 487. Consequently, a correlation value between the even sampling data $D_1, D_3, D_5, D_7, D_9, D_{11}, D_{13}$ and $D_{15}$ of the initial 16 sampling data $D_0$–$D_{15}$ of the digital signal $I_o$ and the 8-bit despreading code sequence $C_7\ C_6\ C_5\ C_4\ C_3\ C_2\ C_1\ C_0$ is obtained and outputted to the outside through the output terminal 405.

Figure 3:
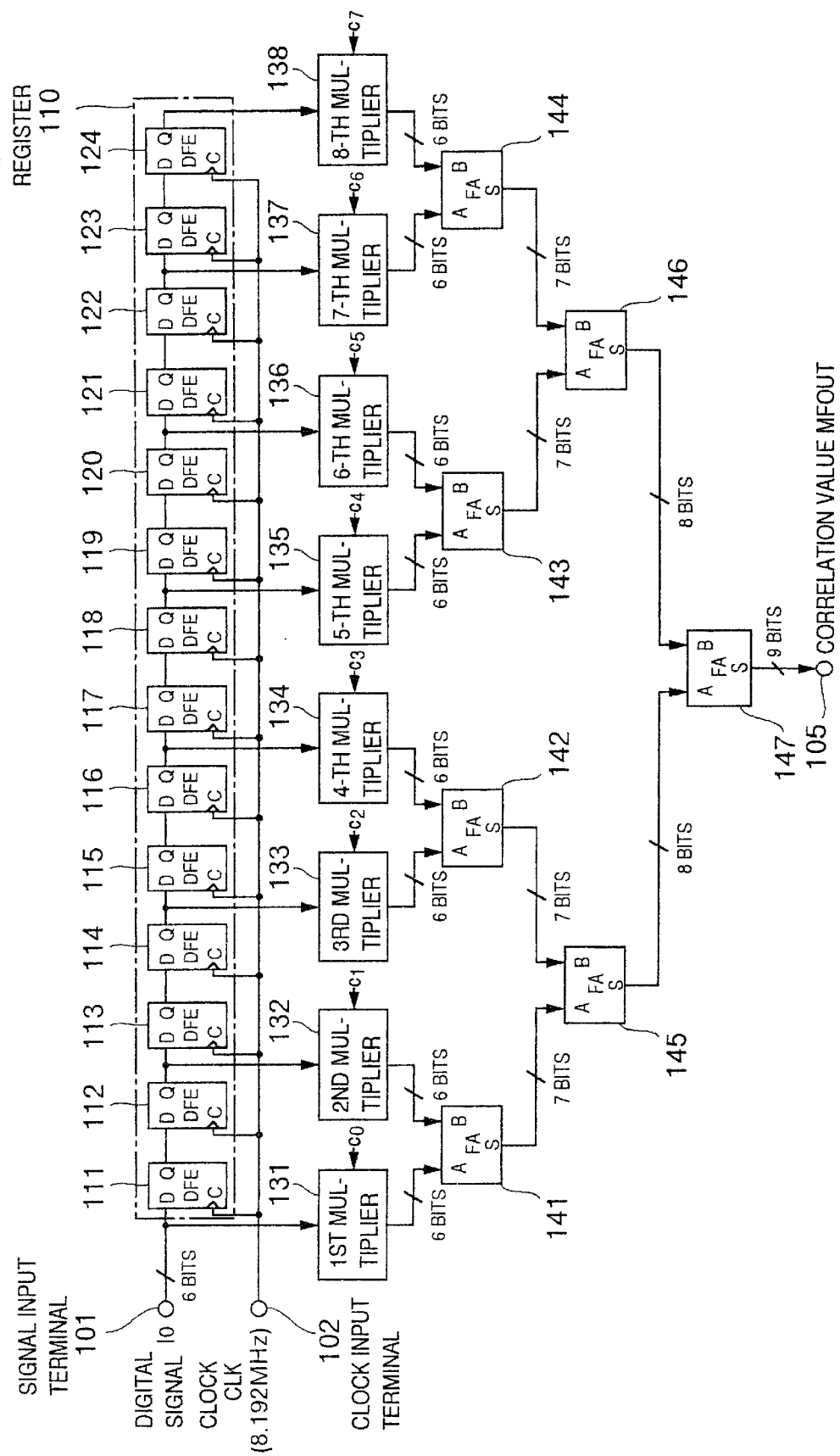
FIG. 3 is a block diagram showing a conventional example of an eight-times spread 16-order digital matched filter constructed by using an FIR 2-times over-sampling interpolation digital filter.

Next, comparison of consumption power in the digital matched filter according to the present embodiment with that in the conventional digital matched filter shown in FIG. 3 will be described. In the digital matched filter according to the present embodiment, during write of the digital signal $I_o$, the first to sixteenth flip-flop sets 411–426 constituting the storage section 410 are operated only one by one in synchronism with the first clock CLK1. Accordingly, on the assumption that consumption power in one flip-flop is W, consumption power in the storage section 410 is identical to the total consumption power in the 6 flip-flops constituting each flip-flop set, amounting up to 6 W. The first to sixteenth write selecting flip-flops 431 to 446 constituting the write selection circuit 430 are operated each time that the first clock CLK1 is inputted, so that consumption power in the write selection circuit 430 is 16 W. The first to eighth despreading code flip-flops 461–468 constituting the despreading code sequence shift register 460 are operated in synchronism with the second clock CLK2 having a frequency which is ½ of that of the first clock CLK1, so that consumption power in the despreading code sequence shift register 460 is 8 W/2=4 W. Accordingly, consumption power in the storage section 410, write selection circuit 430 and despreading code sequence shift register 460 of the digital matched filter according to the present embodiment is 6 W+16 W+4 W=26 W. Contrary to this, in the conventional digital matched filter shown in FIG. 3, the first to fourteenth flip-flop sets 111–124 constituting the tapped shift register 110 are operated each time that the clock CLK is inputted, so that consumption power in the tapped shift register 110 is 6×14 W=84 W. Consumption power in the first to eighth multipliers 471–478 and first to seventh adders 481–487 of the digital matched filter according to the present embodiment is identical to consumption power in the first to eighth multipliers 131–138 and first to seventh adders 141–147 of the conventional digital matched filter shown in FIG. 3. Accordingly, when consumption power in the first to eighth selector circuit sets 451–458 of the digital matched filter according to the present embodiment is neglected because it is small, consumption power in the digital matched filter according to the present embodiment is 26 W/84 W≈1/3 as compared to consumption power in the conventional digital matched filter shown in FIG. 3. Generally, given that the number of bits of the digital signal $I_o$ is N in an M-order digital matched filter of FIR m-times over-sampling interpolation filter structure, the storage section 410 includes MN flip-flops, the write selection circuit 430 includes M write selecting flip-flops and the despreading code sequence shift register 460 includes M/m despreading code flip-flops in the digital matched filter according to the present embodiment. However, the flip-flop sets constituting the storage section 410 are operated only one by one in synchronism with the first clock CLK1. Further, the spreading code sequence shift register 460 is operated in synchronism with the second clock CLK2 having a frequency which is 1/m of that of the first clock CLK1. Therefore, consumption power in the storage section 410, write selection circuit 430 and despreading code sequence shift register 460 of the digital matched filter according to the present embodiment is NW+MW+(M/m$^2$)W=(N+M+M/m$^2$)W. Contrary to this, in the digital matched filter shown in FIG. 3, the tapped shift register 110 includes (M−1)N flip-flops. Therefore, consumption power in the tapped shift register 110 is (M−1)NW. Accordingly, consumption power in the digital matched filter according to the present embodiment is (N+M+M/m$^2$) W/(M−1)NW=(N+M+M/m$^2$)/(M−1)N as compared to consumption power in the conventional matched filter shown in FIG. 3. As M>>1 is generally satisfied, the consumption power in the digital matched filter according to the present embodiment is 1/M+1N+1/m$^2$N as compared to the consumption power in the conventional digital matched filter shown in FIG. 3.

In the digital matched filter according to the present embodiment, a write selection circuit constructed by using a recursive tapped shift register which includes the first to sixteenth write selecting flip-flops and the selector circuit as the write selection circuit 300 shown in FIG. 6 may be used in place of the write selection circuit 430.

In the foregoing description, each despreading code constituting the despreading code sequence $C_7$ $C_6$ $C_5$ $C_4$ $C_3$ $C_2$ $C_1$ $C_0$ is of 1 bit. However, the bit number of each despreading code constituting the despreading code sequence $C_7$ $C_6$ $C_5$ $C_4$ $C_3$ $C_2$ $C_1$ $C_0$ may sometimes be two or more (provided that the bit number of each despreading code is smaller than that of the digital signal $I_o$). For example, each despreading code may be of 2 bits to indicate 1, 0, −1. When the bit number of each despreading code is two or more, a despreading code sequence shift register constructed of a recursive tapped shift register by using 8 flip-flop sets each including two or more flip-flops connected in parallel to each other may be used in place of the despreading code sequence shift register 460 shown in FIG. 8.

Each of the first to eighth multipliers 471–478 may not necessarily be a multiplier constructed of a logical circuit, and may be means for outputting the same multiplication result (for example, a circuit which outputs an input signal as it is when the despreading code is "1", and which inverts the code bit of an input signal and outputs a resulting signal when the despreading code is "0", (multiplication of coefficient "−1")).

(Fourth Embodiment)

Figure 9:
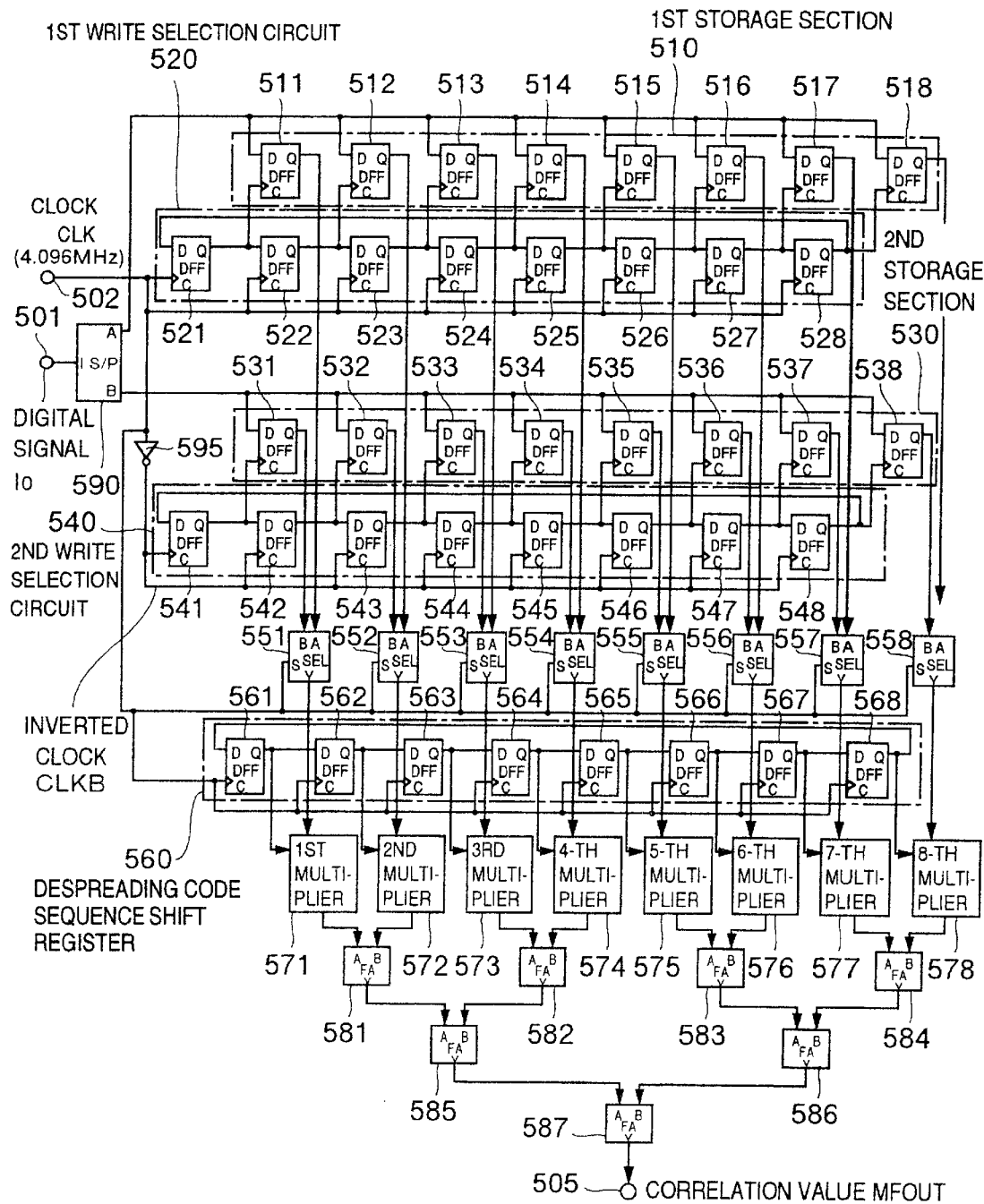
FIG. 9 is a block diagram showing a digital matched filter according to a fourth embodiment of the present invention.

A digital matched filter according to a fourth embodiment of the present invention is a digital matched filter for a case where a digital signal $I_o$ over-sampled at 8.192 MHz is inputted serially in synchronism with a clock of 8.192 MHz. As shown in FIG. 9, it comprises a signal input terminal 501, a clock input terminal 502, a serial/parallel converter 590, an inverter 595, a first storage section 510 including first to eighth flip-flop sets 511–518, a first write selection circuit 520 constructed by using a recursive tapped shift register including first to eighth write selecting flip-flops 521–528, a second storage section 530 including ninth to sixteenth flip-flop sets 531–538, a second write selection circuit 540 constructed by using a recursive tapped shift register including ninth to sixteenth write selecting flip-flops 541–548, first to eighth selector circuit sets 551–558, a despreading code sequence shift register 560 constructed by using a recursive tapped shift register including first to eighth despreading code flip-flops 561–568, first to eighth multipliers 571–578, first to seventh adders 581–587, and an output terminal 505. Here, each of the first to eighth flip-flop sets 511–518 constituting the first storage section 510 and each of the ninth to sixteenth flip-flop sets 531–538 constituting the second storage section 530 are each comprised of 6 flip-flops connected in parallel to each other. Also, each of the first to eighth selector circuit sets 551–558 includes 6 selector circuits connected in parallel to each other.

A digital signal $I_o$ of 8.192 MHz period generated by over-sampling an analog signal (spectrum spread signal) at a sampling frequency of 8.192 MHz is inputted to the signal input terminal 501. The digital signal $I_o$ is a 6-bit digital signal in terms of two's complement. The digital signal $I_o$ is subjected to the serial/parallel conversion by means of the serial/parallel converter 590 so as to be separated into a first digital signal $I_{o1}$ consisting of odd sampling data and a second digital signal $I_{o2}$ consisting of even sampling data. The first digital signal $I_{o1}$ is outputted to the first storage section 510 from a first output terminal A of the serial/parallel converter 590. The second digital signal $I_{o2}$ is outputted to the second storage section 530 from a second output terminal B of the serial/parallel converter 590.

Data input terminals D of the first to eighth flip-flop sets 511–518 constituting the first storage section 510 are connected to the first output terminal A of the serial/parallel converter 502. Clock input terminals C of the first to eighth flip-flop sets 511–518 are applied with output signals of the first to eighth write selecting flip-flops 521–528 constituting the first write selection circuit 520, respectively. In the initial state, "1" is written and held in desired one of the first to eighth write selecting flip-flops 521–528, and "0" is written and held in the other write selecting flip-flops. Hereinafter, for simplification of explanation, it is assumed that in the initial state, the "1" is written and held in only the eighth write selecting flip-flop 528. Clock input terminals C of the first to eighth write selecting flip-flops 521–528 are applied with a clock CLK. When the clock CLK is applied to the clock input terminal C of the eighth write selecting flip-flop 528, the "1" which has been held in the eighth write selecting flip-flop 528 is shifted to the first write selecting flip-flop 521. Subsequently, the ". shifted to the first write selecting flip-flop 521 is shifted from the second write selecting flip-flop 521 toward the eighth write selecting flip-flop 528 in synchronism with the clock CLK. Thereby, the "1" is sequentially applied to the clock input terminals C of the first to eighth flip-flop sets 511–518 constituting the first storage section 510 in synchronism with the clock CLK. As a result, the first digital signal $I_{01}$ is sequentially fetched and held in the first to eighth flip-flop sets 511–518 in synchronism with the clock CLK.

Data input terminals D of the ninth to sixteenth flip-flop sets 531–538 constituting the second storage section 530 are connected to the second output terminal B of the serial/parallel converter 590. Clock input terminals C of the ninth to sixteenth flip-flop sets 531–538 are applied with output signals of the first to eighth write selecting flip-flops 541–548 constituting the second write selection circuit 540, respectively. In the initial state, "1" is written and held in desired one of the ninth to sixteenth write selecting flip-flops 541–548, and "0" is written and held in the other write selecting flip-flops. Hereinafter, for simplification of explanation, it is assumed that in the initial state, the "1" is written and held in only the sixteenth write selecting flip-flop 548. Clock input terminals C of the ninth to sixteenth write selecting flip-flops 541–548 are applied with a clock (hereinafter called "inverted clock CLKB") obtained by inverting the polarity of the clock CLK by means of the inverter 595. When the inverted clock CLKB is applied to the clock input terminal C of the sixteenth write selecting flip-flop 548, the "1" which has been held in the sixteenth write selecting flip-flop 548 is shifted to the ninth write selecting flip-flop 541. The "1" shifted to the ninth write selecting flip-flop 541 is subsequently shifted from the ninth write selecting flip-flop 541 to the sixteenth write selecting flip-flop 548 in synchronism with the inverted clock CLKB. Thereby, the "1" is sequentially applied to the clock input terminals C of the eighth to sixteenth flip-flop sets 531–538 constituting the second storage section 530 in synchronism with the inverted clock CLKB. As a result, the second digital signal $I_{02}$ is sequentially fetched and held in the ninth to sixteenth flip-flop sets 531–538 in synchronism with the inverted clock CLKB.

Selection terminals S of the respective selector circuits constituting the first to eighth selector circuit sets 551–558 are applied with the clock CLK. When the clock CLK is "1", a first input terminal A is selected, and when the clock CLK is "0", a second input terminal B is selected. Accordingly, when the clock CLK is "1", output signals of the first to eighth flip-flop sets 511–518 constituting the first storage section 510 which are connected to the first input terminals A of the first to eighth selector circuit sets 551–558 are selected and outputted from output terminals Y of the first to eighth selector circuit sets 551–558, respectively. On the other hand, when the clock CLK is "0", output signals of the ninth to sixteenth flip-flop sets 531–538 constituting the second storage section 530 which are connected to the second input terminals B of the first to eighth selector circuit sets 551–558 are selected and outputted from the output terminals Y of the first to eighth selector circuit sets 551–558, respectively.

The first to eighth despreading code flip-flops 561–568 constituting the despreading code sequence shift register 560 are stored with despreading codes of an 8-bit despreading code sequence $C_7$ $C_6$ $C_5$ $C_4$ $C_3$ $C_2$ $C_1$ $C_0$, respectively. Hereinafter, for simplification of explanation, it is assumed that in the initial state, the despreading codes $C_7$–$C_0$ are stored in the first to eighth despreading code flip-flops 561–568, respectively. Clock input terminals C of the first to eighth despreading code flip-flops 561–568 are applied with the clock CLK. The despreading codes stored in the first to eighth despreading code flip-flops 561–568 are shifted from the first despreading code flip-flop 561 toward the eighth despreading code flip-flop 568 in synchronism with the clock CLK. It is to be noted that a despreading code which has been shifted to the eighth despreading code flip-flop 568 is shifted to the first despreading code flip-flop 561 in synchronism with the next clock CLK. Thereby, the despreading codes $C_0$–$C_7$ are sequentially shifted and outputted from the first to eighth despreading code flip-flops 561–568 in order of from the despreading code $C_0$ to the despreading code $C_7$ the in synchronism with the clock CLK.

Each of the first to eighth multipliers 571–578 is a multiplier for 6 bits×1 bit, and outputs an output signal of 6 bits. In the first to eighth multipliers 571–578, multiplication operations of the first digital signal $I_{01}$ (6 bits) outputted from the first to eighth selector circuit sets 551–558 by the despreading codes (1 bit) outputted from the first to eighth despreading code flip-flops 561–568 are respectively carried out during the period in which the clock CLK is "1". At the same time, multiplication operations of the second digital signal $I_{02}$ (6 bits) outputted from the first to eighth selector circuit sets 551–558 by the despreading codes (1 bit) outputted from the first to eighth despreading code flip-flops 561–568 are respectively carried out during the period in which the clock CLK is "0". For example, when the despreading code indicates "1", multiplication operations of the output signals of the first to eighth selector circuit sets 551–558 by "1" are carried out in the multipliers 571–578. When the despreading code indicates "0", multiplication operations of the output signals of the first to eighth selector circuit sets 551–558 by "−1" are carried out.

Each of the first to fourth adders 581–584 is an adder for 6 bits+6 bits, and outputs an output signal of 7 bits. Each of the fifth and sixth adders 585 and 586 is an adder for 7 bits+7 bits, and outputs an output signal of 8 bits. The seventh adder 587 is an adder for 8 bits+8 bits, and outputs an output signal of 9 bits. In the first adder 581, addition of the output signal (6 bits) of the first multiplier 571 and the output signal (6 bits) of the second multiplier 572 is carried out. In the second adder 582, addition of the output signal (6 bits) of the third multiplier 573 and the output signal (6 bits) of the fourth multiplier 574 is carried out. In the third adder 583, addition of the output signal (6 bits) of the fifth multiplier 575 and the output signal (6 bits) of the sixth multiplier 576 is carried out. In the fourth adder 584, addition of the output signal (6 bits) of the seventh multiplier 577 and the output signal (6 bits) of the eighth multiplier 578 is carried out. In the fifth adder 585, addition of the output signal (7 bits) of the first adder 581 and the output signal (7 bits) of the second adder 582 is carried out. In the sixth adder 586, addition of the output signal (7 bits) of the third adder 583 and the output signal (7 bits) of the fourth adder 584 is carried out. In the seventh adder 587, addition of the output signal (8 bits) of the fifth adder 585 and the output signal (8 bits) of the sixth adder 586 is carried out.

In the digital matched filter according to the present embodiment constructed as above, when 16 clocks CLK are inputted following the initial state, initial first to eighth sampling data $D_0$–$D_7$ of the first digital signal $I_{01}$ are written and held in the first to eighth flip-flop sets 511–518 constituting the first storage section 510, respectively. Initial first to eighth sampling data $d_0$–$d_7$ of the second digital signal $I_{02}$ are written and held in the ninth to sixteenth flip-flop sets 531–536 constituting the second storage section 530, respectively. The despreading codes $C_7$–$C_0$ are shifted to the first to eighth despreading code flip-flops 561–568 constituting the despreading code string shift register 560 and held therein, respectively. As a result, when the clock CLK is "1", the sampling data $D_0$–$D_7$ of the first digital signal $I_o$, are selected by means of the first to eighth selector circuit sets 551–558, so that $D_7 \times C_0 + D_6 \times C_1 + D_5 \times C_2 + D_4 \times C_3 + D_3 \times C_4 + D_2 \times C_5 + D_1 \times C_6 + D_0 \times C_7$ is obtained in the seventh adder 587. Thereby, a correlation value MFOUT between the initial 8 sampling data $D_0$–$D_7$ of the first digital signal $I_{o1}$ and the 8-bit despreading code sequence $C_7\ C_6\ C_5\ C_4\ C_3\ C_2\ C_1\ C_0$ is obtained and outputted to the outside through the output terminal 505. When the clock CLK is "0", the sampling data $d_0$–$d_7$ of the second digital signal $I_{o2}$ are selected by means of the first to eighth selector circuit sets 551–558, so that $d_7 \times C_0 + d_6 \times C_1 + d_5 \times C_2 + d_4 \times C_3 + d_3 \times C_4 + d_2 \times C_5 + d_1 \times C_6 + d_0 \times C_7$ is obtained in the seventh adder 587. Thereby, a correlation value MFOUT between the initial 8 sampling data $d_0$–$d_7$ of the second digital signal $I_{o2}$ and the 8-bit despreading code sequence $C_7\ C_6\ C_5\ C_4\ C_3\ C_2 C_1\ C_0$ is obtained and outputted to the outside through the output terminal 505. As a result, an eight-times spread 16-order digital matched filter which is constructed by using the FIR 2-times over-sampling interpolation digital filter, like the digital matched filter according to the third embodiment shown in FIG. 8, can be realized.

In the digital matched filter according to the present embodiment, a write selection circuit constructed by using a recursive tapped shift register which includes the first to eighth write selecting flip-flops and the selector circuit as the write selection circuit 300 shown in FIG. 6 may be used in place of the first and second write selection circuits 520–540.

In the foregoing description, each despreading code constituting the despreading code sequence $C_7\ C_6\ C_5\ C_4\ C_3\ C_2\ C_1\ C_0$ is of 1 bit. However, the bit number of each despreading code constituting the despreading code sequence $C_7\ C_6\ C_5\ C_4\ C_3\ C_2\ C_1\ C_0$ may sometimes be two or more (provided that the bit number of each despreading code is smaller than that of the digital signal $I_o$). For example, each despreading code may be of 2 bits to indicate 1, 0, -1. When the bit number of each despreading code is two or more, a despreading code sequence shift register constructed of a recursive tapped shift register using 8 flip-flop sets each including two or more flip-flops connected in parallel to each other may be used in place of the despreading code sequence shift register 560 shown in FIG. 9.

Each of the first to eighth multipliers 571–578 may not necessarily be a multiplier constructed of a logical circuit, and may be means for outputting the same multiplication result (for example, a circuit which outputs an input signal as it is when the despreading code is "1", and which inverts the code bit of the input signal and outputs a resulting signal when the despreading code is "0" (multiplication of coefficient "-1")).

(Fifth Embodiment)

Figure 10:
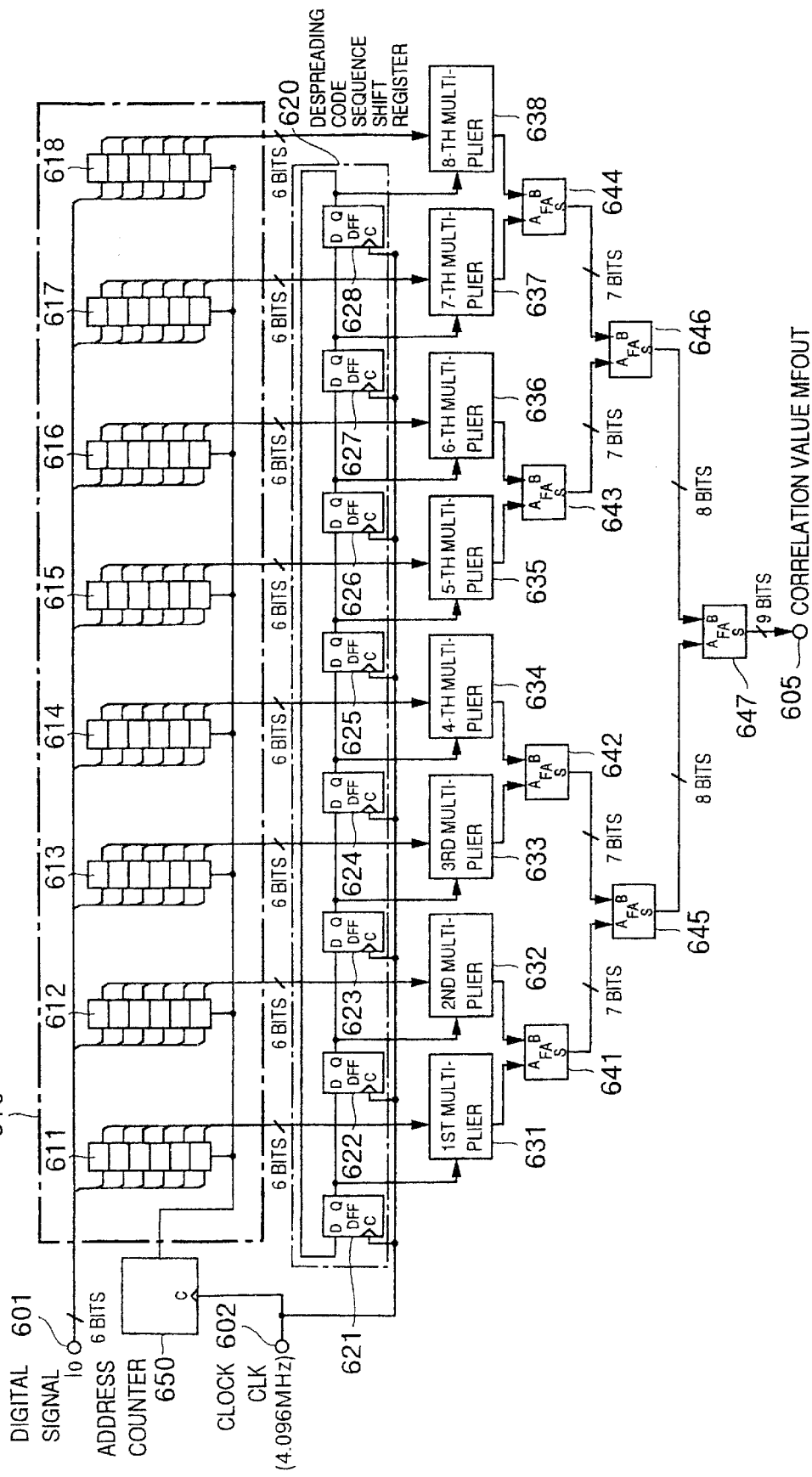
FIG. 10 is a block diagram showing a digital matched filter according to a fifth embodiment of the present invention.

A digital matched filter according to a fifth embodiment of the present invention is an eight-times spread 8-order digital matched filter constructed by using memory devices. AS shown in FIG. 10, it comprises a signal input terminal 601, a clock input terminal 602, an address counter 650, a storage section 610 including first to eighth memories 611–618, a despreading code sequence shift register 620 constructed by using a recursive tapped shift register including first to eighth despreading code flip-flops 621–628, first to eighth multipliers 631–638, first to seventh adders 641–647, and an output terminal 605. Here, the addresses of the first to eighth memories 611–618 constituting the storage section 610 are defined as 0-th to seventh addresses, respectively.

A digital signal $I_o$ generated by sampling an analog signal (spectrum spread signal) at a sampling frequency of 4.096 MHz is inputted to the signal input terminal 601. The digital signal $I_o$ is a 6-bit digital signal in terms of two's complement that is synchronous with a clock CLK of 4.096 MHz inputted from the clock input terminal 602. Data input terminals of the first to eighth memories 611–618 constituting the storage section 610 are applied with the digital signal $I_o$. Address input terminals of the first to eighth memories 611–618 are applied with an output signal of the address counter 650.

The address counter 650 is a 3-bit counter which counts the clock CLK applied through a clock input terminal C. For simplification of explanation, it is assumed that in the initial state, the output signal of the address counter 650 is rendered to be "111" which indicates the seventh address. When the initial clock CLK is applied to the clock input terminal C of the address counter 650, the output signal of the address counter 650 is rendered to be "000" which indicates the 0-th address, so that the first memory 611 of the storage section 610 is placed in writable condition. When the second clock CLK is applied to the clock input terminal C of the address counter 650, the output signal of the address counter 650 is rendered to be "001" which indicates the first address, so that the second memory 612 is placed in writable condition. Subsequently, the third to eighth memories 613–618 are sequentially placed in writable condition in a similar manner in synchronism with the clock CLK. Thereafter, when the ninth clock CLK is applied to the clock input terminal C of the address counter 650, the output signal of the address counter 650 is rendered to be "000" which indicates the 0-th address, so that the first memory 611 of the storage section 610 is placed in writable condition. Accordingly, the digital signal $I_o$ is sequentially fetched and held in the first to eighth memories 611–618 constituting the storage section 610 in synchronism with the clock CLK.

The first to eighth despreading code flip-flops 621–628 constituting the despreading code sequence shift register 620 are written with despreading codes of an 8-bit despreading code sequence $C_7\ C_6\ C_5\ C_4\ C_3\ C_2\ C_1\ C_0$, respectively. Hereinafter, for simplification of explanation, it is assumed that in the initial state, the despreading codes $C_7$–$C_0$ are stored in the first to eighth despreading code flip-flops 561–568, respectively. Clock input terminals C of the first to eighth despreading code flip-flops 621–628 are applied with the clock CLK, and the despreading codes written in the first to eighth despreading code flip-flops 621–628 are shifted from the first despreading code flip-flop 621 toward the eighth despreading code flip-flop 628 in synchronism with the clock CLK. It is to be noted that a despreading code which has been shifted to the eighth despreading code flip-flop 628 is shifted to the first despreading code flip-flop 621 in synchronism with the next clock CLK. Thereby, the despreading code $C_0$–$C_7$ are outputted from the first to eighth despreading code flip-flops 621–628 while being shifted sequentially in synchronism with the clock CLK. Each of the first to eighth multipliers 631–638 is a multiplier for 6 bits×1 bit, and outputs an output signal of 6 bits. In the first to eighth multipliers 631–638, multiplication operations of the digital signal $I_o$ (6 bits) outputted from the first to eighth memories 611–618 by the despreading codes (1 bit) outputted from the first to eighth despreading code flip-flops 621–628 are carried out, respectively. When the despreading code indicates "0", multiplication operations of the output signals of the first to eighth memories 611–618 by "-1" are carried out in the multipliers 631–638. The procedure for multiplication in the multipliers 631–638 will be described hereunder.

In the first operation state, a first sampling data $D_0$ of the digital signal $I_o$ is inputted to the signal input terminal 601 in synchronism with the clock CLK, and the clock CLK is applied to the clock input terminal C of the address counter 650. As a result, the output signal of address counter 650 is rendered to be "111" indicative of the seventh address in the initial state is rendered to be "000" indicative of the 0-th address. Consequently, the first sampling data $D_0$ is written and held in the first memory 611. Also, the despreading code $C_0$ which has been stored in the eighth despreading code flip-flop 628 of the despreading code sequence shift register 620 in the initial state is shifted to the first despreading code flip-flop 621 in synchronism with the clock CLK. As a result, multiplication of the first sampling data $D_0$ by the despreading code $C_0$ is carried out in the first multiplier 631. Accordingly, an output signal indicative of a value of $D_0 \times C_0$ is outputted from the first multiplier 631.

In the second operation state, a second sampling data $D_1$ of the digital signal $I_o$ is inputted to the signal input terminal 201 in synchronism with the clock CLK, and the clock CLK is applied to the clock input terminal C of the address counter 650. As a result, the output signal of the address counter 650 is rendered to be "001" indicative of the first address. Consequently, the second sampling data $D_1$ is written and held in the second memory 612. At that time, in the first memory 611 of the storage section 610, the first sampling data $D_0$ which has been written thereto in the first operation state is held as it is. The despreading codes stored in the despreading code sequence shift register 620 are shifted in synchronism with the clock CLK. As a result, the despreading code $C_0$ which has been shifted to the first despreading code flip-flop 621 in the first operation state is shifted to the second despreading code flip-flop 622, and the despreading code Cl which has been stored in the eighth despreading code flip-flop 628 is shifted to the first despreading code flip-flop 621. Consequently, multiplication of the second sampling data $D_1$ by the despreading code $C_0$ is carried out in the second multiplier 632, and multiplication of the first sampling data $D_0$ by the despreading code $C_1$ is carried out in the first multiplier 631. Accordingly, an output signal indicative of a value of $D_1 \times C_0$ is outputted from the second multiplier 632, and an output signal indicative of a value of $D_0 \times C_1$ is outputted from the first multiplier 631. Subsequently, a similar operation is repeated until the seventh operation state.

In the eighth operation state, an eighth sampling data $D_7$ of the digital signal $I_o$ is inputted to the signal input terminal 601 in synchronism with the clock CLK, and the clock CLK is applied to the clock input terminal C of the address counter 650. As a result, the output signal of the address counter 650 is rendered to be "111" indicative of the seventh address. Consequently, the eighth sampling data $D_7$ is written and held in the eighth memory 618. At that time, in the first to seventh memories 611–617 of the storage section 610, the first to seventh sampling data $D_0$–$D_6$ which have been written thereto up to the seventh operation state are held, respectively. Also, the despreading codes stored in the despreading code sequence shift register 620 are shifted in synchronism with the clock CLK, so that the despreading codes $C_7$–$C_0$ are stored in the first to eighth despreading code flip-flops 621–628, respectively. Thereby, multiplication operations of the first to eighth sampling data $D_0$–$D_7$ of the digital signal $I_o$, which are held in the first to eighth memories 611–618 of the storage section 610, by the despreading codes $C_7$–$C_0$ which are stored in the first to eighth flip-flops 621–628 of the despreading code sequence shift register 620 are carried out in the first to eighth multipliers 631–638, respectively. As a result, an output signal indicative of a value of $D_7 \times C_0$ is outputted from the eighth multiplier 638, an output signal indicative of a value of $D_6 \times C_1$ is outputted from the seventh multiplier 637, an output signal indicative of a value of $D_5 \times C_2$ is outputted from the sixth multiplier 636, an output signal indicative of a value of $D_4 \times C_3$ is outputted from the fifth multiplier 635, an output signal indicative of a value of $D_3 \times C_4$ is outputted from the fourth multiplier 634, an output signal indicative of a value of $D_2 \times C_5$ is outputted from the third multiplier 633, an output signal indicative of a value of $D_1 \times C_6$ is outputted from the second multiplier 632, and an output signal indicative of a value of $D_0 \times C_7$ is outputted from the first multiplier 631.

Through the above operation, multiplication operations necessary to determine a correlation value between the initial 8-sampling data $D_7$ $D_6$ $D_5$ $D_4$ $D_3$ $D_2$ $D_1$ $D_0$ of the digital signal $I_o$ and the 8-bit despreading code sequence $C_6$ $C_5$ $C_4$ $C_3$ $C_2$ $C_1$ $C_0$ are all carried out.

In the ninth operation state, a ninth sampling data $D_8$ of the digital signal $I_o$ is inputted to the signal input terminal 601 in synchronism with the clock CLK, and the clock CLK is applied to the clock input terminal C of the address counter 604. As a result, the output signal of the address counter 604 is rendered to be "000" indicative of the 0-th address. Consequently, the ninth sampling data De is written and held in the first memory 611. At that time, in the second to eighth memories 612 to 618 of the storage section 610, the second to eighth sampling data $D_1$–$D_7$ which have been written thereto up to the eighth operation state are held, respectively. Also, the despreading codes stored in the despreading code sequence shift register 620 are shifted in synchronism with the clock CLK, so that the despreading code $C_0$ is shifted to the first despreading code flip-flop 621, and the despreading codes $C_7$–$C_1$ are shifted to the second to eighth despreading code flip-flops 622–628, respectively. Thereby, multiplication of the ninth sampling data D. of digital signal $I_o$ held in the first memory 611 of the storage section 610 by the despreading code $C_0$ shifted to the first despreading code flip-flop 621 of the despreading code sequence shift register 620 is carried out in the first multiplier 631, and multiplication operations of the second to eighth sampling data $D_1$–$D_7$ of digital signal $I_o$ held in the second to eighth memories 612–618 by the despreading codes $C_7$–$C_1$ shifted to the second to eighth despreading code flip-flops 622–628 of the despreading code sequence shift register 620 are carried out in the second to eighth multipliers 632–638, respectively. As a result, an output signal indicative of a value of $D_8 \times C_0$ is outputted from the first multiplier 631, an output signal indicative of a value of $D_7 \times C_1$ is outputted from the eighth multiplier 638, an output signal indicative of a value of $D_6 \times C_2$ is outputted from the seventh multiplier 637, an output signal indicative of a value of $D_5 \times C_3$ is outputted from the sixth multiplier 636, an output signal indicative of a value of $D_4 \times C_4$ is outputted from the fifth multiplier 635, an output signal indicative of a value of $D_3 \times C_5$ is outputted from the fourth multiplier 634, an output signal indicative of a value of $D_2 \times C_6$ is outputted from the third multiplier 633, and an output signal indicative of a value of $D_1 \times C_7$ is outputted from the second multiplier 632.

As a result, multiplication operations necessary to determine a correlation value between the 8-sampling data $D_8$ $D_7$ $D_6$ $D_5$ $D_4$ $D_3$ $D_2$ $D_1$, which is one sampling after the initial 8-sampling data $D_7$ $D_6$ $D_5$ $D_4$ $D_3$ $D_2$ $D_1$ Dot by the 8-bit despreading code sequence $C_7$ $C_6$ $C_5$ $C_4$ $C_3$ $C_2$ $C_1$ $C_0$ are all carried out. Subsequently, a similar operation is repeated.

Each of the first to fourth adders 641–644 is an adder for 6 bits+6 bits, and outputs an output signal of 7 bits. Each of the fifth and sixth adders 645 and 646 is an adder for 7 bits+7 bits, and outputs an output signal of 8 bits. The seventh adder 647 is an adder for 8 bits+8 bits, and outputs an output signal of 9 bits. In the first adder 641, addition of the output signal (6 bits) of the first multiplier 631 and the output signal (6 bits) of the second multiplier 632 is carried out. In the second adder 642, addition of the output signal (6 bits) of the third multiplier 633 and the output signal (6 bits) of the fourth multiplier 634 is carried out. In the third adder 643, addition of the output signal (6 bits) of the fifth multiplier 635 and the output signal (6 bits) of the sixth multiplier 636 is carried out. In the fourth adder 644, addition of the output signal (6 bits) of the seventh multiplier 637 and the output signal (6 bits) of the eighth multiplier 638 is carried out. In the fifth adder 645, addition of the output signal (7 bits) of the first adder 641 and the output signal (7 bits) of the second adder 642 F>t=is carried out. In the sixth adder 646, addition of the output signal (7 bits) of the third adder 643 and the output signal (7 bits) of the fourth adder 644 is carried out. In the seventh adder 647, addition of the output signal (8 bits) of the fifth adder 645 and the output signal (8 bits) of the sixth adder 646 is carried out. As a result, a correlation value MFOUT between the digital signal $I_o$ and the despreading code sequence $C_7\ C_6\ C_5\ C_4\ C_3\ C_2\ C_1\ C_0$ is obtained and outputted to the outside through the output terminal 605.

In the foregoing description, each despreading code constituting the despreading code sequence $C_7\ C_6\ C_5\ C_4\ C_3\ C_2\ C_1\ C_0$ is of 1 bit. However, the number of bits of each despreading code constituting the despreading code sequence $C_7\ C_6\ C_5\ C_4\ C_3\ C_2\ C_1\ C_0$ may sometimes be two or more (provided that the bit number of each despreading code is smaller than that of the digital signal $I_o$). For example, each despreading code may be of 2 bits to indicate 1, 0, −1. When the bit number of each despreading code is two or more, a despreading code sequence shift register constructed of a recursive tapped shift register using 8 flip-flop sets each including two or more flip-flops connected in parallel to each other may be used in place of the despreading code sequence shift register 620 shown in FIG. 10.

Each of the first to eighth multipliers 631–638 may not necessarily be a multiplier constructed of a logical circuit but may be means for outputting the same multiplication result (for example, a circuit which outputs an input signal as it is when the despreading code is "1", and which inverts the code bit of the input signal and outputs a resulting signal when the despreading code is "0" (multiplication of coefficient −1)).

When an eight-times spread 16-order digital matched filter is constructed by using the FIR 2-times over-sampling interpolation digital filter as shown in FIG. 8, a storage section including 16 memories may be used in place of the storage section 410, and a counter for sequentially designating addresses of the 16 memories may be used in place of the write selection circuit 430.

When a digital matched filter is constructed which determines a correlation value between the over-sampled digital signal as shown in FIG. 9 and the despreading code sequence, two storage sections each including 8 memories may be used in place of the first and second storage sections 510 and 530, and two counters for sequentially designating addresses of the 8 memories of the 2 storage sections may be used in place of the first and second write selection circuits 520 and 530.

INDUSTRIAL APPLICABILITY

As has been described hereinbefore, in the digital matched filter of the present invention, consumption power can be reduced more greatly than in the conventional matched filter, and the filter can be constructed of only the digital circuits. Accordingly, by utilizing the digital matched filter of the present invention, LSI formation can be facilitated together with the peripheral circuit for digital signal processing and for example, the receiver for spectrum spread communication can be reduced in size.

What is claimed is:

1. A digital matched filter for determining a correlation value between an N-bit digital signal, which is synchronous with a clock, and a digital code sequence which includes M digital codes, comprising:

a) first to M-th digital signal storing means applied with said N-bit digital signal;

b) digital write selection means for sequentially selecting said first to M-th digital signal storing means one by one in synchronism with said clock to store said N-bit digital signal in the selected digital signal storing means;

c) a recursive shift register for digital code sequence having first to M-th stages of code flip-flops connected in cascade, and being operative in synchronism with said clock, wherein said M digital codes are stored in said first to M-th stages of code flip-flops, respectively, and an output terminal of said M-th stage of code flip-flop is connected to an input terminal of said first stage of code flip-flop;

d) first to M-th digital multiplication means for multiplying output signals of said first to M-th digital signal storing means by output signals of said first to M-th stages of code flip-flops, respectively; and e) digital addition means for adding output signals of said first to M-th digital multiplication means.

2. A digital matched filter according to claim 1, wherein each of said first to M-th digital signal storing means includes N flip-flops which are connected in parallel and are operative in synchronism with said clock;

said digital write selection means includes:

a write selecting recursive shift register having first to M-th stages of write selecting flip-flops connected in cascade, and being operative in synchronism with said clock, wherein an output signal of said M-th stage of write selecting flip-flop being applied to said first stage of write selecting flip-flop; and upon start of operation, a signal for selecting said digital signal storing means is stored in desired one of said first to M-th stages of write selecting flip-flops.

3. A digital matched filter according to claim 1, wherein each of said first to M-th digital signal storing means includes N flip-flops which are connected in parallel and are operative in synchronism with said clock; and said digital write selecting means includes:

first to M-th stages of write selecting flip-flops connected in cascade, reset before start of operation, and operated in synchronism with said clock after start of operation; and a digital selection circuit outputting a signal for selecting said digital signal storing means to said first stage of write selecting flip-flop during only a period shorter than one period of said clock after start of operation, and outputting an output signal of said M-th stage of write selecting flip-flop to said first stage of write selecting flip-flop after said period has elapsed.

4. A digital matched filter according to claim 1, wherein
said first to M-th digital signal storing means include first to M-th memories of N bits, and
said digital write selecting means includes an address counter which counts said clock to sequentially output addresses of said first to M-th memories in synchronism with said clock.

5. A digital matched filter for determining a correlation value between an N-bit digital signal, which is over-sampled by a first clock having a frequency which is m-times as large as a second clock, and a digital code sequence which includes M digital codes, comprising:
   a) m×M digital signal storing means applied with said N-bit digital signal;
   b) digital write selecting means for sequentially selecting said m×M digital signal storing means one by one in synchronism with said first clock to store said N-bit digital signal in the selected digital signal storing means;
   c) first to M-th digital selection means dividing said m×M digital signal storing means by m to divide said m×M digital signal storing means into M blocks to sequentially select and output output signals of said m digital signal storing means included in said M blocks within one period of said second clock;
   d) a recursive shift register for digital code sequence having first to M-th stages of code flip-flops which are connected in cascade, and being operative in synchronism with said second clock, wherein
      said M digital codes are stored in said first to M-th staged of code flip-flops, respectively, and
      an output terminal of said M-th stage of code flip-flop is connected to an input terminal of said first stage of code flip-flop;
   e) first to M-th digital multiplication means for multiplying output signals of said first to M-th digital selection means by output signals of said first to M-th stages of code flip-flops, respectively; and
   f) digit al addition means for adding output signals of said first to M-th digital multiplication means.

6. A digital matched filter according to claim 5, wherein
each of said m×M digital signal storing means includes N flip-flops which are connected in parallel and are operative in synchronism with said first clock, and
said digital write selection means includes:
a write selecting recursive shift register having first to (m×M)-th stages of write selecting flip-flops connected in cascade, and being operative in synchronism with said first clock, wherein an output signal of said (m×M)-th stage of write selecting flip-flop being applied to said first stage of write selecting flip-flop; and
upon start of operation, a signal for selecting said digital signal storing means is stored in desired one of said first to (m×M)-th stages of write selecting flip-flops.

7. A digital matched filter according to claim 5, wherein
each of said m×M digital signal storing means includes N flip-flops which are connected in parallel and are operative in synchronism with said first clock, and
said digital write selection means includes:
first to (m×M)-th stages of write selecting flip-flops connected in cascade, reset before start of operation, and operated in synchronism with said first clock after start of operation; and
a digital selection circuit outputting a signal for selecting said digital signal storing means to said first stage of write selecting flip-flop during only a period shorter than one period of said first clock after start of operation, and outputting an output signal of said (m×M)-th stage of write selecting flip-flop to said first stage of write selecting flip-flop after said period has elapsed.

8. A digital matched filter according to claim 5, wherein
said m×M digital signal storing means include m×M memories of N bits, and
said digital write selection means includes an address counter which counts said first clock to sequentially output addresses of said m×M memories in synchronism with said first clock.

9. A digital matched filter for determining a correlation value between an N-bit digital signal, which is over-sampled by a first clock having a frequency which is m-times as large as a second clock, and a digital code sequence which includes M digital codes, comprising:
   a) serial/parallel conversion means for serial/parallel converting said digital signal serially inputted to output first to m-th digital signals in parallel;
   b) first to m-th digital signal storage means applied with said first to m-th digital signals from said serial/parallel conversion means, respectively, and having each M memory units;
   c) digital write selection means for sequentially selecting said M memory units one by one in synchronism with said second clock every said first to m-th digital storage means to store said respective first to M-th digital signals in said respective selected memory units;
   d) first to M-th digital selection means for sequentially selecting and outputting output signals of said first to m-th digital signal storing means within one period of said second clock every said M memory units, respectively;
   e) a recursive shift register for digital code sequence having first to M-th stages of code flip-flops which are connected in cascade, and being operative in synchronism with said second clock, wherein
      said M digital codes are stored in said first to M-th stages of code flip-flops, respectively, and
      an output terminal of said M-th stage of code flip-flop is connected to an input terminal of said first stage of code flip-flop;
   f) first to M-th digital multiplication means for multiplying output signals of said first to M-th digital selection means by output signals of said first to M-th stages of code flip-flops, respectively; and
   g) digital addition means for adding output signals of said first to M-th digital multiplication means.

10. A digital matched filter according to claim 9, wherein
each of said M memory units of said first to m-th digital signal storing means includes N flip-flops which are connected in parallel and being operative in synchronism with said second clock;
said digital write selection means includes:
first to m-th write selecting recursive shift registers each having first to M-th write selecting flip-flops connected in cascade, and being operative in synchronism with said second clock, wherein an output signal of said M-stage of write selecting flip-flop being applied to said first stage of write selecting flip-flop; and
upon start of operation, signals for selecting said M memory units of said first to m-th digital signal storing means are stored in desired ones of said first to M-th stages of write selecting flip-flops of said first to m-th write selecting recursive shift registers, respectively.

11. A digital matched filter according to claim 9, wherein each of said M memory units of said first to m-th digital signal storing means includes N flip-flops which are connected in parallel and are operative in synchronism with said second clock, and said digital write selection means includes:

first to m-th write selecting shift registers each having first to M-th stages of write selecting flip-flops connected in cascade, reset before start of operation, and operated in synchronism with said second clock after start of operation; and first to m-th digital selection circuits for outputting signals for selecting said M memory units of said first to m-th digital signal storing means to said first to M-th stages of write selecting flip-flops of said first to m-th write selecting shift registers, respectively, during only a shorter period than one period of said second clock after start of operation, and for outputting output signals of said M-th stages of write selecting flip-flops of said first to m-th write selecting shift registers to said first stages of write selecting flip-flops of said respective first to m-th write selecting shift registers after said period has elapsed.

12. A digital matched filter according to claim 9, wherein each of said M memory units of said respective first to m-th digital signal storing means includes a digital signal storing memory of N bits, and said digital write selection means includes an address counter for counting said second clock to sequentially output addresses of said digital signal storing memories in synchronism with said second clock every said first to m-th digital signal storing means.

* * * * *